United States Patent
Yamaguchi et al.

(10) Patent No.: US 6,780,748 B2
(45) Date of Patent: Aug. 24, 2004

(54) METHOD OF FABRICATING A WAFER LEVEL CHIP SIZE PACKAGE UTILIZING A MASKLESS EXPOSURE

(75) Inventors: Yoshihide Yamaguchi, Fujisawa (JP); Hiroyuki Tenmei, Yokohama (JP); Hiroshi Hozoji, Hitachiota (JP); Naoya Kanda, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/207,083

(22) Filed: Jul. 30, 2002

(65) Prior Publication Data

US 2003/0109079 A1 Jun. 12, 2003

(30) Foreign Application Priority Data

Dec. 7, 2001 (JP) .......................... 2001-373505

(51) Int. Cl.[7] .......................... H01L 21/44; H01R 43/16
(52) U.S. Cl. .................. 438/612; 438/613; 438/622; 29/874; 29/884
(58) Field of Search ................... 438/106, 108, 438/110, 113, 612–614, 622, 623; 257/700–702, 723, 724, 758, 759; 29/825, 829, 874, 884

(56) References Cited

U.S. PATENT DOCUMENTS

| | | | |
|---|---|---|---|
| 5,330,878 A | | 7/1994 | Nelson |
| 6,144,102 A | * | 11/2000 | Amagai ................. 257/781 |
| 6,310,390 B1 | * | 10/2001 | Moden ................... 257/668 |
| 6,329,222 B1 | * | 12/2001 | Corisis et al. .......... 438/118 |

FOREIGN PATENT DOCUMENTS

| | | |
|---|---|---|
| JP | 62-21294 | 1/1987 |
| JP | 10-32159 | 2/1998 |
| JP | 11-111768 | 4/1999 |
| JP | 2000-305279 | 11/2000 |

* cited by examiner

*Primary Examiner*—Alonzo Chambliss
(74) *Attorney, Agent, or Firm*—Antonelli, Terry, Stout & Kraus, LLP

(57) ABSTRACT

In the re-wiring formation process of a WLCSP, at least some of the re-wiring lines 3 that connect the bonding pads 1 and bump pads 2 of the semiconductor chips are formed using a photolithographic process that does not use a photomask. In this re-wiring formation process, standard portions are formed by development following photomask exposure, and portions that are to be designed corresponding to customer specifications are subjected to additional development following additional maskless exposure in the final stage.

20 Claims, 17 Drawing Sheets

FIG.1
(a)
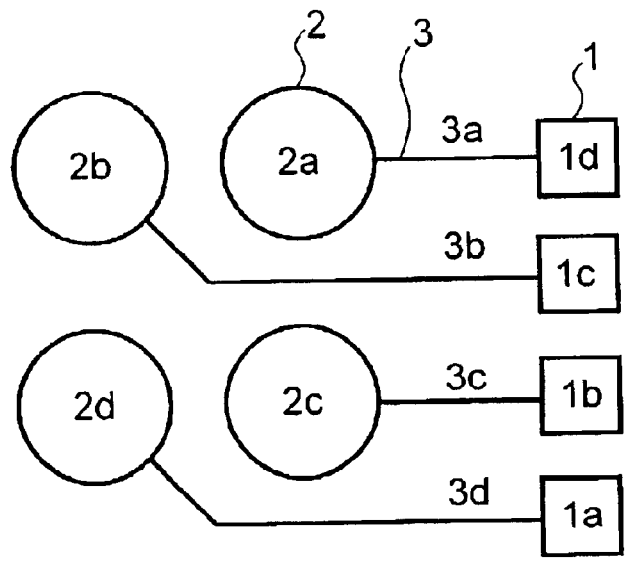
(b)
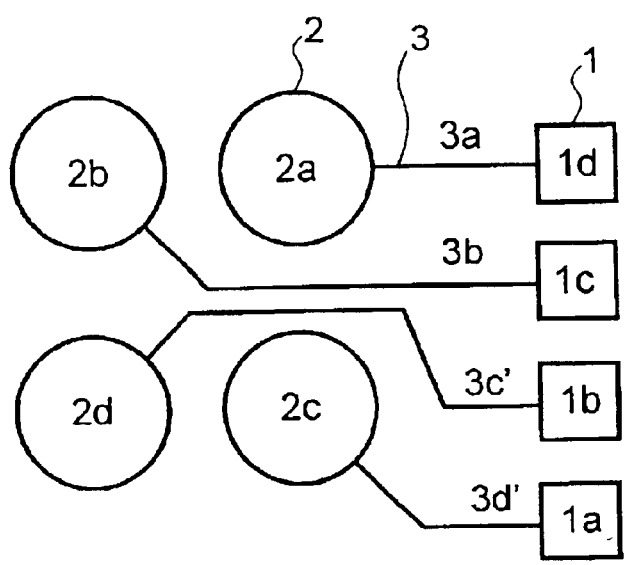
1 (1a~1d): BONDING PADS
2 (2a~2c): BUMP PADS
3 (3a~3d, 3c', 3d'): RE-WIRING LINES

FIG.2
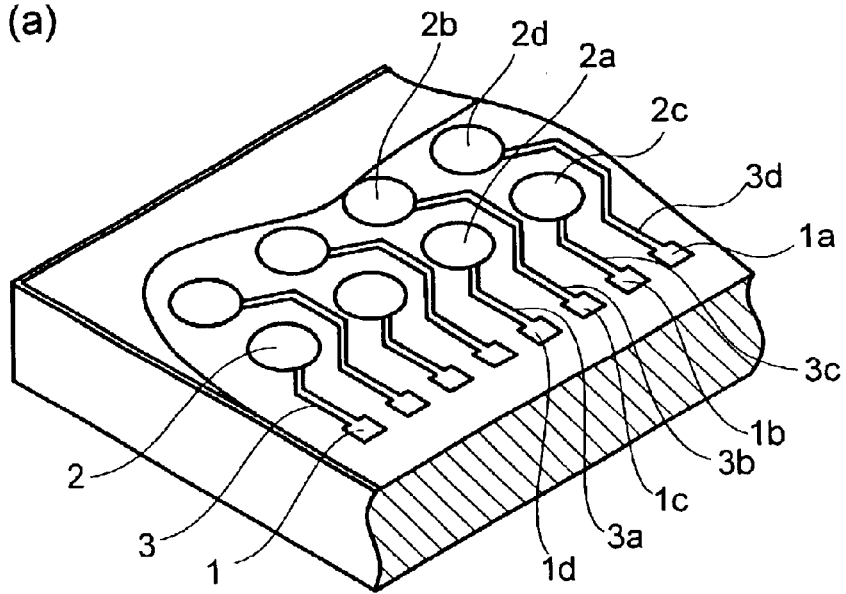
(a)
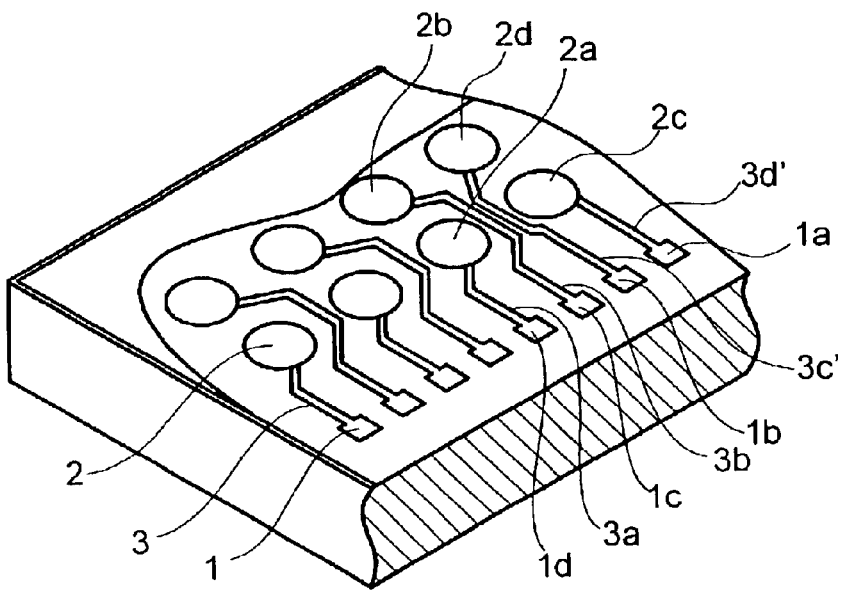
(b)

FIG.3
(a)
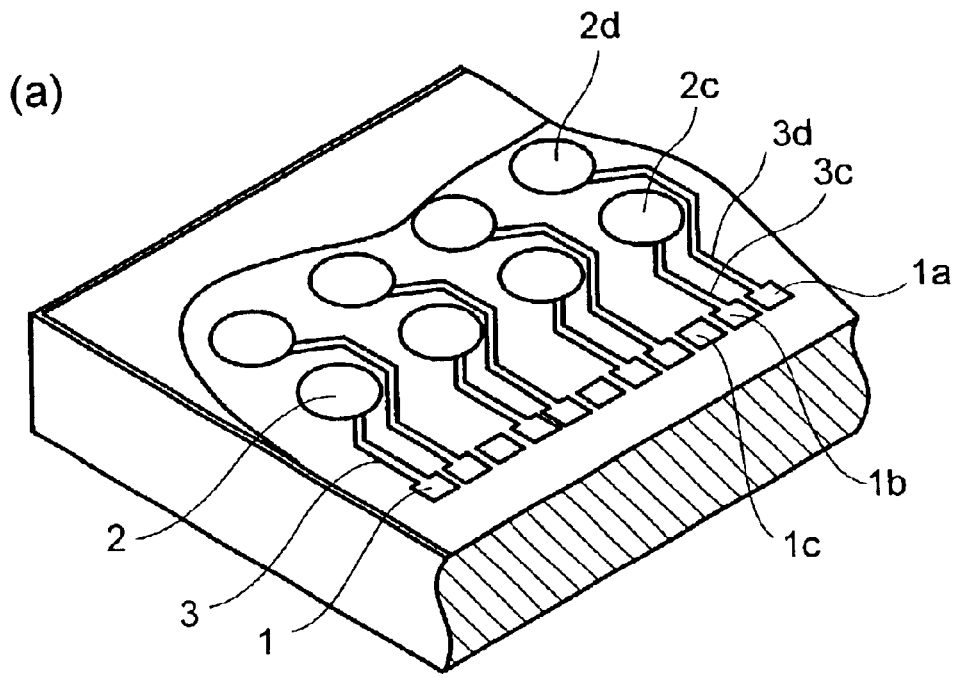
(b)
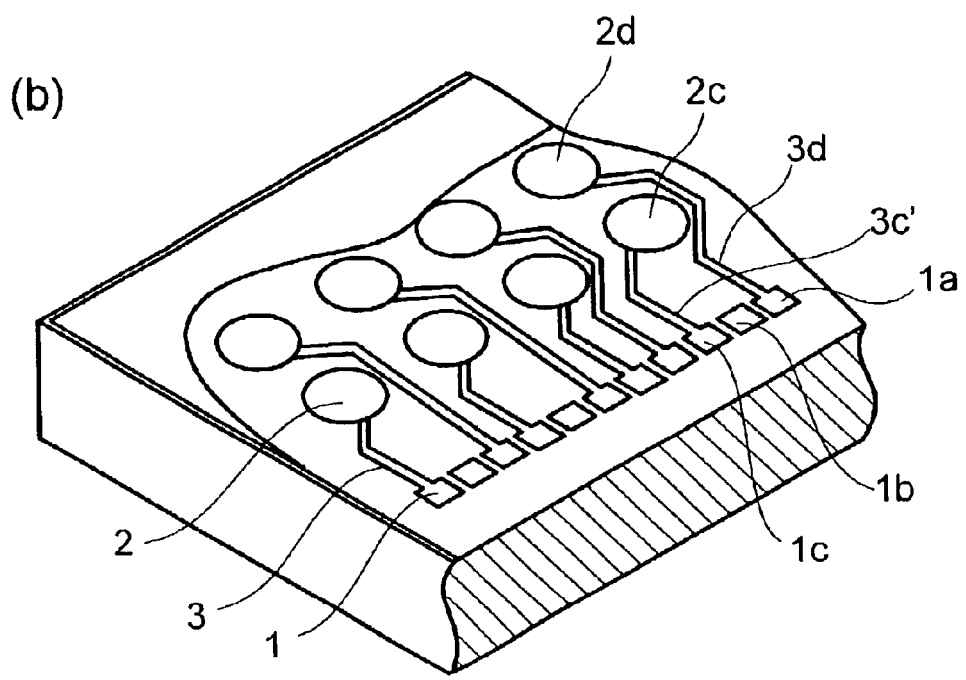

FIG.4
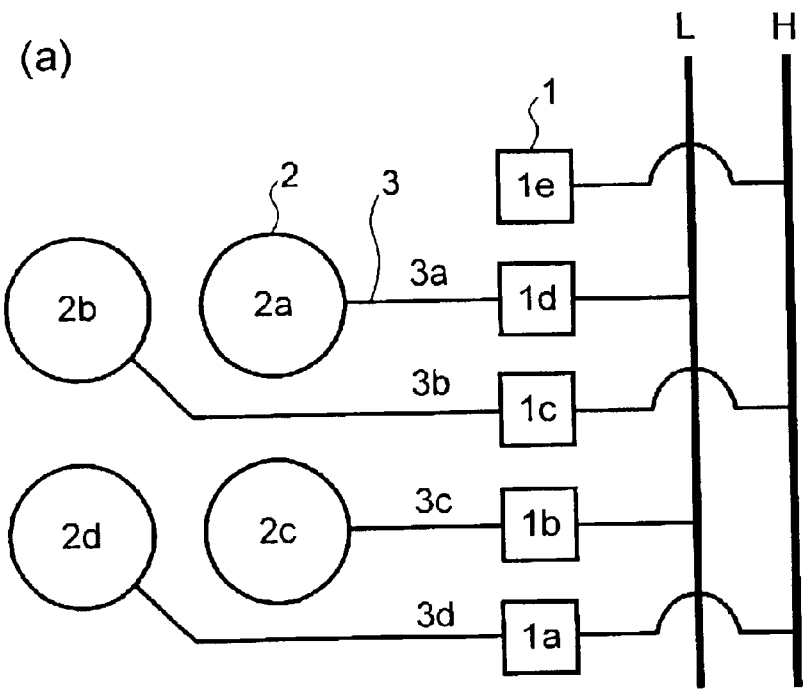
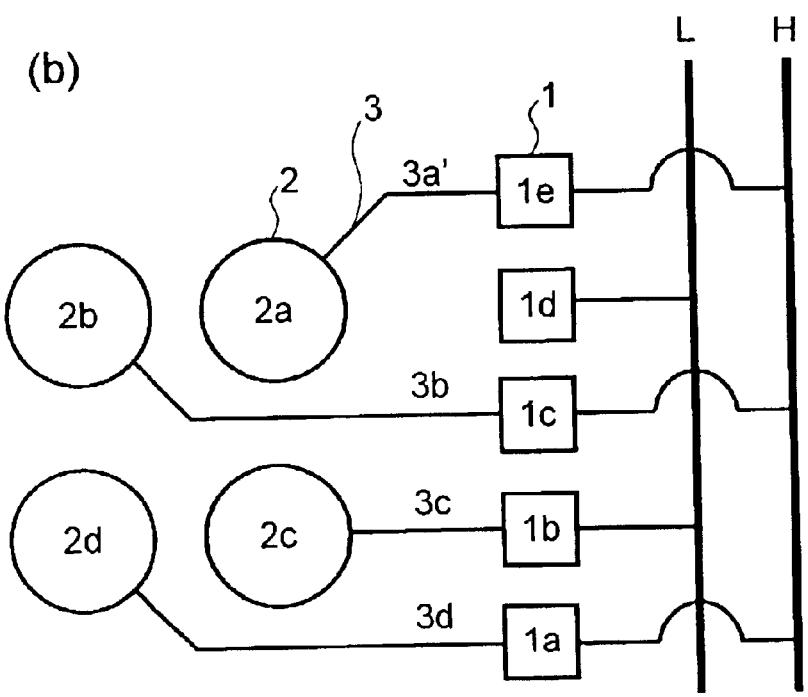

FIRST STEP

SECOND STEP

FIG.10
THIRD STEP
(a) 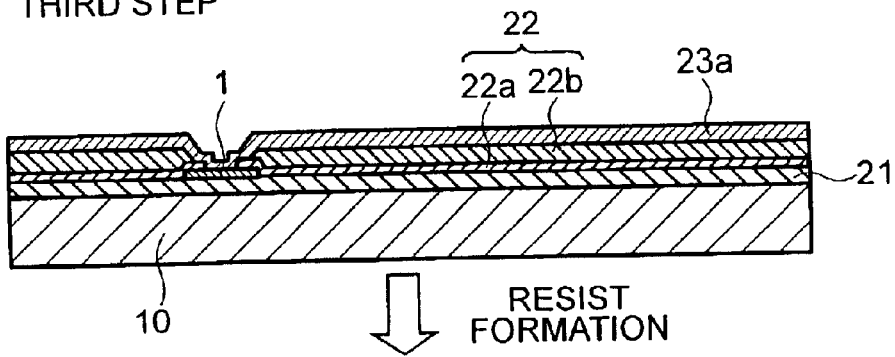
↓ RESIST FORMATION
(b) 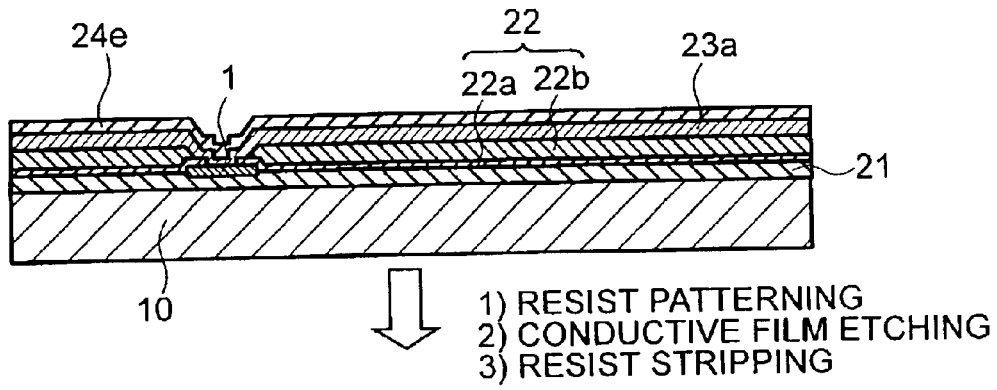
↓ 1) RESIST PATTERNING
2) CONDUCTIVE FILM ETCHING
3) RESIST STRIPPING
(c) 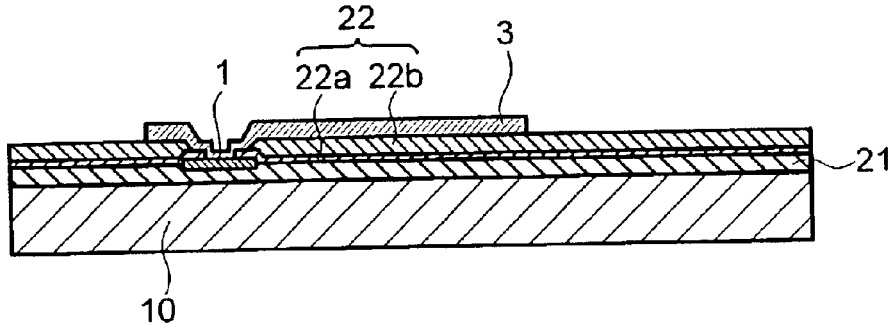

FIG.11
(a)
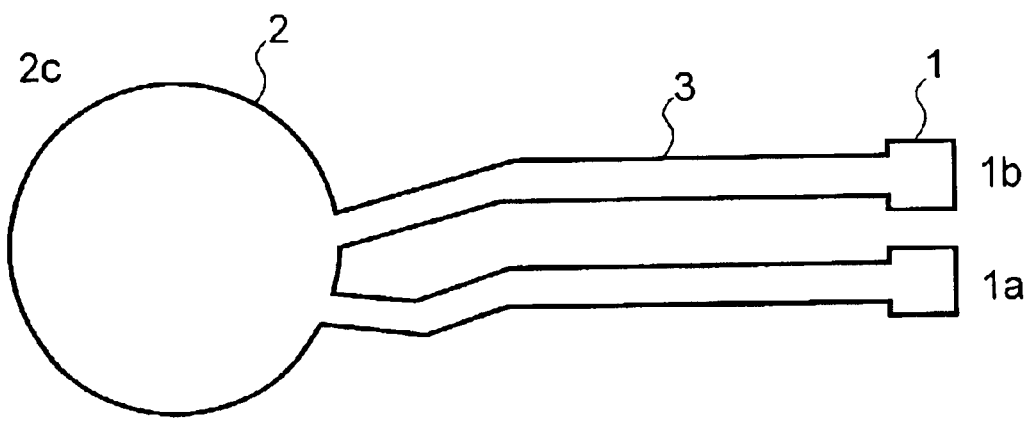
(b)
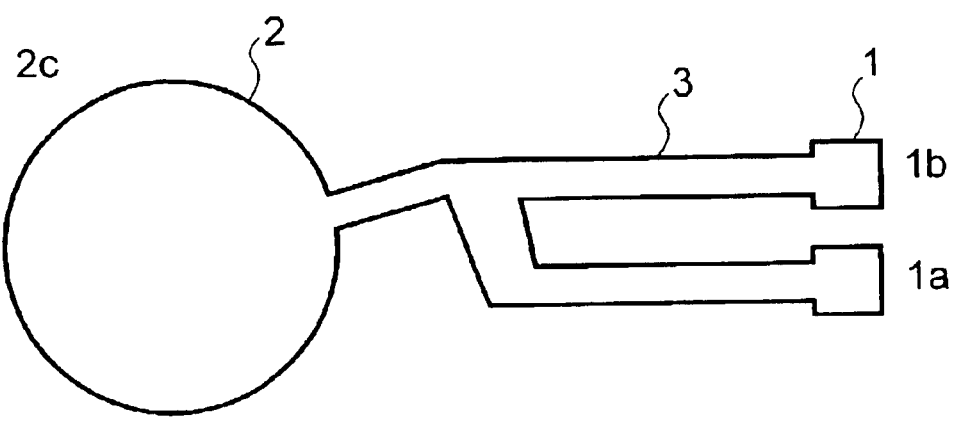

FIG.12
(a)
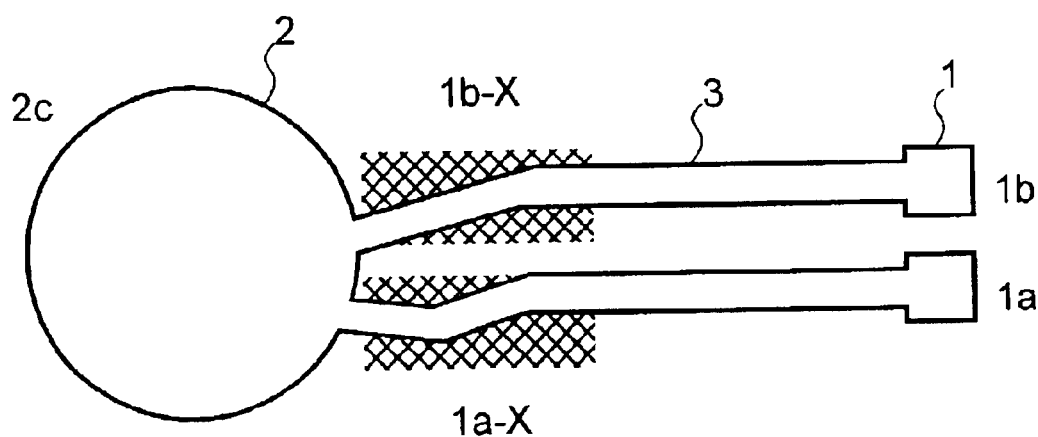
(b)
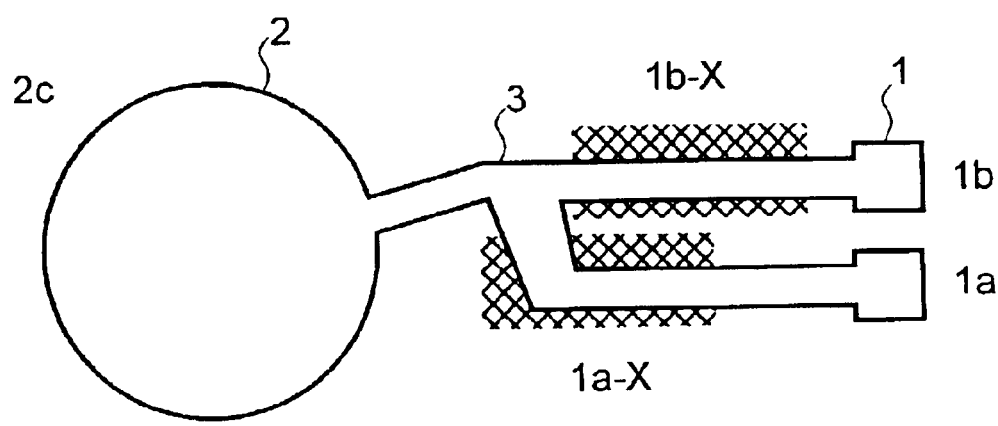

FIG.13
(a)
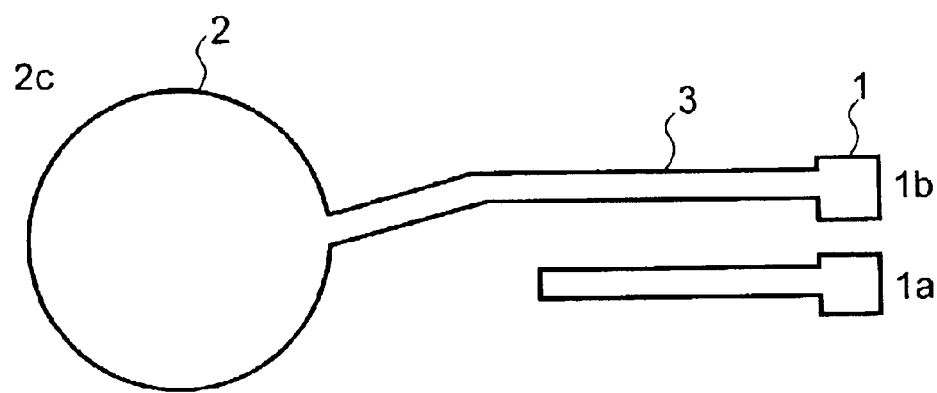
(b)
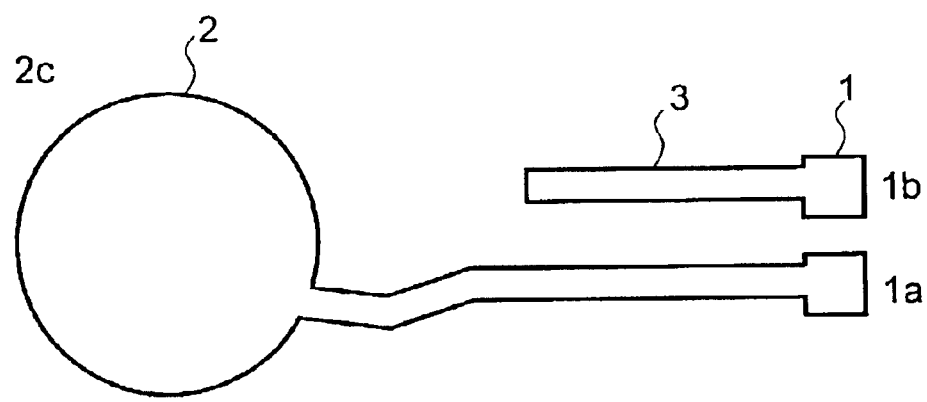

FOURTH STEP

FIFTH STEP

METHOD OF FABRICATING A WAFER LEVEL CHIP SIZE PACKAGE UTILIZING A MASKLESS EXPOSURE

BACKGROUND OF THE INVENTION

The present invention relates to a semiconductor device for flip-chip connections and to a technique for manufacturing the same. More particularly, the present invention relates to a technique that is effective when applied to a semiconductor device and a manufacturing method using the technique known as "wafer level packaging", in which a packaging process is performed at one time in the wafer state on a plurality of semiconductor chips formed in a semiconductor wafer via a wafer process.

According to an investigation performed by the present inventor, the following techniques may be considered with respect to semiconductor devices and semiconductor device manufacturing methods. Generally, most semiconductor devices have laminated structures, and, in most cases, insulating layers are disposed between the respective layers of such semiconductor devices. Opening parts are formed in these insulating layers, and wiring, which connects the terminals of the upper layers and the terminals of the lower layers, is formed so that this wiring passes through these opening parts.

The following method is used to form the abovementioned insulating layers. Specifically, the semiconductor device is coated with a photosensitive insulating material by a spin-coating process, and opening parts are formed in the insulating layer by performing exposure and development. Furthermore, in regard to the metal wiring that connects the terminals of the lower layers and the terminals of the upper layers, the surface of each insulating layers coated with a second photosensitive material, and a mask is formed by subjecting this material to exposure and development; then, metal wiring, which connects the terminals of the layer beneath the insulating layer and the layer above the insulating layer, is formed by using a process such as plating, sputtering, CVD, vacuum evaporation or the like in combination with this. After the photosensitive insulating material that has been used as a mask becomes unnecessary, this material is removed. Wiring that connects the terminals in layers beneath the insulating layers and the terminals in layers above the insulating layers can be formed by means of the above processes.

For example, in semiconductor devices using the wafer level packaging technique, bonding pads consisting of aluminum or the like form the terminals in layers beneath the insulating layers, and bump pads form the terminals in layers above the insulating layers. Furthermore, such an insulating layer is formed on the surface of the semiconductor wafer in which semiconductor chips have been formed, and opening parts are formed in this insulating layer above the bonding pads. Moreover, metal wiring is formed from the bonding pads to the bump pads in the layer above the insulating layer. Bumps are formed on these bump pads. Furthermore, such formation of wiring from the bonding pads to the bump pads is called "re-wiring". Moreover, the thickness of the insulating layer in this case is more or less equal to the thickness of the metal wiring.

Since the abovementioned processes are performed at one time on a plurality of semiconductor chips in a wafer state, this technique is characterized in that the cost of the assembly process can be reduced. Furthermore, the size of the respective semiconductor devices, after the devices have been split into individual units following the completion of the assembly process, is the same as the chip size (chip size packaging, CSP). Because of these two special features, the abovementioned process is referred to as "wafer level chip size packaging", and the semiconductor devices formed by the abovementioned process are called "wafer level chip size packages". Furthermore, techniques that provide such wafer level chip size packages are sometimes called "wafer level chip size packaging techniques". Moreover, the terms "wafer level chip size packaging", "wafer level chip size packaging techniques" and "wafer level chip size package" are all sometimes abbreviated to "WLCSP".

One of the configurations whereby semiconductor devices manufactured by such a process are mounted and connected to a circuit board, such as a printed wiring board, is a flip-chip connection. Here, the connections between the semiconductor device and the circuit board are realized by a process in which the bumps formed on the bump pads of the semiconductor device are melted and then re-solidified on the circuit board. The gap between the semiconductor device and the circuit board is filled with a high-rigidity resin. Furthermore, this filling material, consisting of a high-rigidity resin, is called "underfill", and it has the effect of reinforcing the connection parts. Examples of flip-chip-connected semiconductor devices using such underfill are described in Japanese Patent Application Laid-Open No. H11-111768 and the like.

SUMMARY OF THE INVENTION

The following facts became clear as a result of an investigation of the abovementioned semiconductor devices and manufacturing methods, as conducted by the present inventor. Semiconductor devices are often shipped after being subjected to treatments in which the word-bit construction is altered, the width of the input-output bus is altered, or they are screened according to the operating speed of the semiconductor element. For example, in the case of memory elements, such as DRAM elements or the like, a method, such as the so-called bonding option or the like, in which the positions of the external connection terminals that are connected with the bonding wires are altered, may be employed in order to construct a semiconductor memory device with a wide bit width.

However, in the case of WLCSP of the type described above, a wire bonding technique is not used; accordingly, it is difficult to alter the positions of the pads connected with the individual re-wiring by means of such a method. For example, FIG. 18 is a schematic diagram of essential parts illustrating one example of the re-wiring structure in WLCSP. Here, a plurality of re-wiring lines 3, that electrically connect the bonding pads 1 and bump pads 2, are formed at one time by a photolithographic technique. Accordingly, in order to alter the connecting circuit of the bonding pads 1 and bump pads 2, it is necessary to alter the photomask used in the photolithographic process that forms the re-wiring lines 3; however, this creates problems in terms of time and cost, and prevents a flexible response.

Furthermore, in order to allow alteration of the connections between the bonding pads and bump pads in WLCSP of the type described above, it is also possible to incorporate a fuse circuit beforehand into the connection parts between the bonding pads and the bump pads, and to cut the fuses of this fuse circuit by means of a laser or the like, thus providing the performance required by the customer. In the case of this method, however, problems occur in terms of time and reliability, e.g., heat is generated when the fuses are cut by means of a laser, and an extra cutting process is required, so that such a method cannot be advantageously used.

Accordingly, it is an object of the present invention to provide a technique which makes it possible to respond flexibly to alterations in the connections of re-wiring in WLCSP. Moreover, it is an object of the present invention to provide a technique for obtaining semiconductor devices with the performance required by customers in a short time by accomplishing alterations in the connections of re-wiring in a simple and flexible manner.

Typical constituent elements of the invention disclosed in the present application may be briefly described as follows: specifically, the semiconductor device manufacturing method of the present invention comprises a step in WLCSP in which a wiring layer such as re-wiring is formed, wherein at least a portion of this wiring layer is formed using a photolithographic technique that does not use a photomask (i.e., that does not require a photomask), with one portion of this wiring layer being connected to first connection terminals, such as bonding pads, and with the remaining portion of this wiring layer being connected to second connection terminals, such as bump pads. As a result, the combination of connections of these first connection terminals, such as bonding pads, and second connection terminals, such as bump pads, that are connected to each other by the wiring layer, such as re-wiring, can be simply and quickly rearranged, so that semiconductor devices that have the performance required by the customer can be provided in a short time.

BRIEF DESCRIPTION OF THE DRAWINGS

FIGS. 1(a) and 1(b) are wiring connection diagrams showing the wiring connection structure of re-wiring in a semiconductor device constituting one embodiment of the present invention;

FIGS. 2(a) and 2(b) are perspective views corresponding respectively to FIGS. 1(a) and 1(b), which show the wiring connection structure of re-wiring in a semiconductor device constituting one embodiment of the present invention;

FIGS. 3(a) and 3(b) are perspective views showing the wiring connection structure of different re-wiring in one embodiment of the present invention;

FIGS. 4(a) and 4(b) are wiring diagrams illustrating the concept of alteration of the word-bit construction in a semiconductor device in one embodiment of the present invention;

FIGS. 10(a) through 10(c) are sectional views of part of a semiconductor device illustrating a third step in a semiconductor device manufacturing process of one embodiment of the present invention;

FIGS. 11(a) and 11(b) are diagrams showing photomask patterns in a semiconductor device manufacturing process of one embodiment of the present invention;

FIGS. 12(a) and 12(b) are diagrams illustrating maskless exposure in a semiconductor device manufacturing process of one embodiment of the present invention;

FIGS. 13(a) and 13(b) are diagrams illustrating maskless exposure in a semiconductor device manufacturing process of one embodiment of the present invention;

DESCRIPTION OF THE PREFERRED EMBODIMENTS

Figure 5:
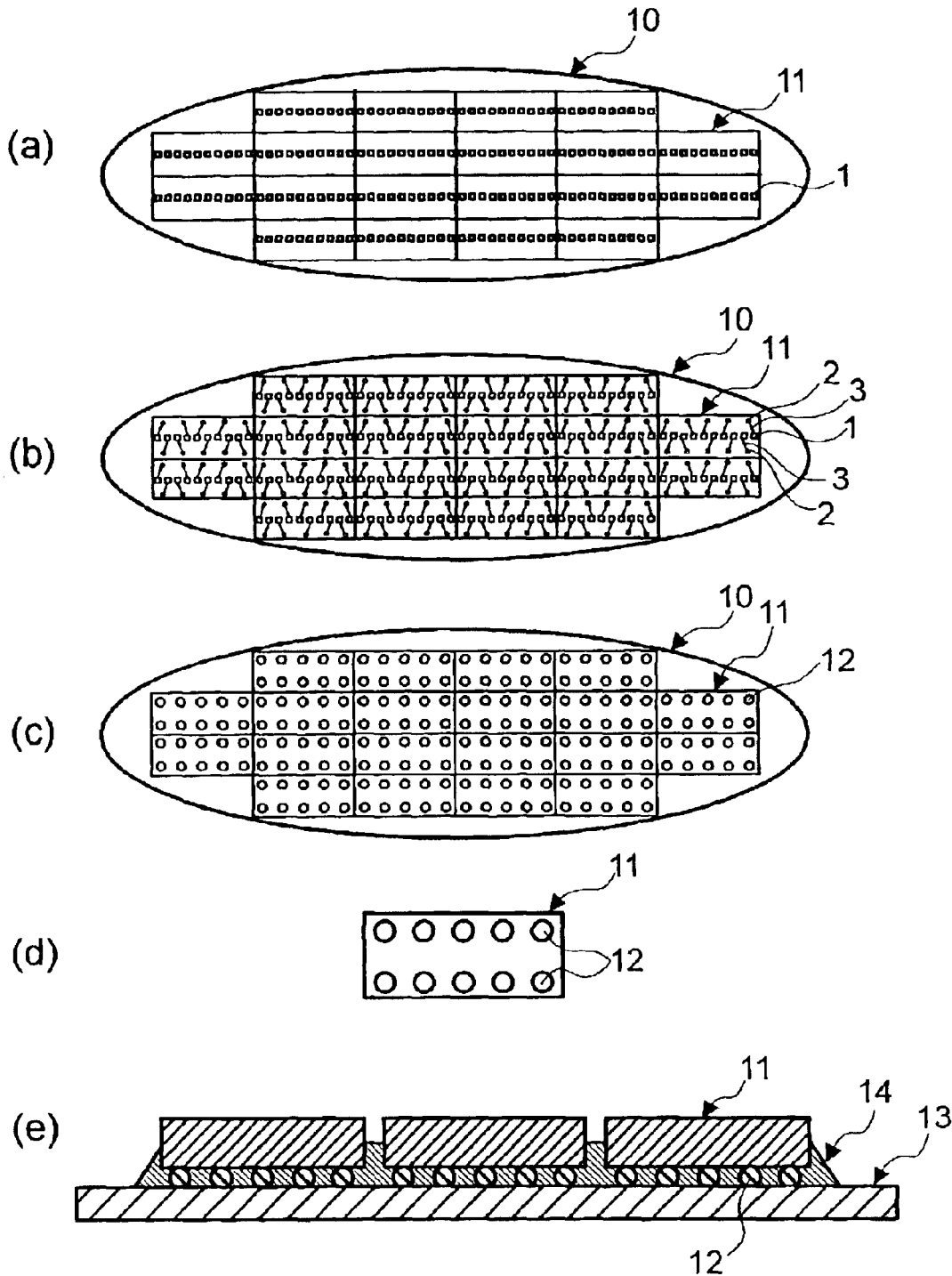
FIGS. 5(a) through 5(e) are diagrams which outline the semiconductor device manufacturing process in one embodiment of the present invention.

Embodiments of the present invention will be described in detail below with reference to the attached figures. Furthermore, in all of the figures which illustrate the various embodiments, the same members are labeled with the same symbols, and repetitive descriptions thereof are omitted. Furthermore, in order to facilitate the description, there may be cases where numerical quantities, dimensional ratios and the like of various members differ between respective figures, and these values may also differ from those of actual members.

First, one example of the concept of the wiring connection structure of re-wiring realized by a semiconductor device manufacturing method constituting one embodiment of the present invention will be described with reference to FIGS. 1(a) through 4(b). FIGS. 1(a) and 1(b) are wiring connection diagrams showing the wiring connection structure of re-wiring in a semiconductor device; FIGS. 2(a) and 2(b) are perspective views corresponding respectively to FIGS. 1 (a) and 1(b), which show the wiring connection structure of re-wiring; FIGS. 3(a) and 3(b) are perspective views showing the wiring connection structure of different re-wiring, and FIGS. 4(a) and 4(b) are wiring diagrams illustrating the concept of alteration of the word-bit construction in the semiconductor device.

In the semiconductor device realized by the technique of the present embodiment, the wiring connections of the re-wiring can be easily divided, as shown in FIGS. 1(a) and 1(b). Specifically, the bonding pads 1 (first connection terminals) disposed on the main surface of the semiconductor chip and bump pads 2 (second connection terminals) are electrically connected by re-wiring lines 3 (wiring layer). In the case of FIG. 1(a), the bonding pad 1–1a and bump pad 2–2d are connected by the re-wiring line 3–3d; similarly, 1b and 2c are connected by 3c, 1c and 2b are connected by 3b, and 1d and 2a are connected by 3a. In the case of FIG. 1(b), on the other hand, pads 1a and 1b among the bonding pads 1 and pads 2c and 2d among the bump pads 2 are connected as follows: specifically, 1a and 2c are connected by 3d', and 1b and 2d are connected by 3c'.

More specifically, in a case where the wiring pattern that connects the re-wiring lines 3 between the bonding pads 1 and bump pads 2 is laid out in a pattern corresponding to FIG. 1(a), as shown in FIG. 2(a), the connections between the bonding pads 1 and bump pads 2 can be altered by varying the routing paths of the re-wiring lines 3 in a manner corresponding to FIG. 1(b), so that the wiring pattern is laid out as shown in FIG. 2(b).

Furthermore, FIGS. 3(a) and 3(b) show an example of the layout of the wiring pattern in a case where the bonding pads 1 are installed in greater numbers than the bump pads 2, and in which the extra bonding pads 1 are not connected to bump pads 2 by re-wiring lines 3. In this example as well, in a case where pads 1a and 1b among the bonding pads 1 and pads 2d and 2c among the bump pads 2 are respectively connected by re-wiring lines 3d and 3c as shown in FIG. 3(a), the layout of the wiring pattern can be altered by connecting the bonding pad 1c, which was previous unwired, to the bump pad 2c by a re-wiring line 3c', and leaving the bonding pad 1b unwired, as shown in FIG. 3(b)

Such a wiring connection structure of the re-wiring 3 can be formed as a bonding option in the final stage of the re-wiring formation process, which will be described later. For instance, in the example shown in FIG. 4, in a case where the bonding pads 1a, 1c and 1e are electrically connected to the power supply wiring on the high-potential (H) side, and the bonding pads 1b and 1d are electrically connected to the power supply wiring on the low-potential (L) side, the bump pad 2a can be connected to the bonding pad 1d by a re-wiring line 3a, thus connecting the bump pad 2a to the low potential (L), as shown in FIG. 4(a), or the bump pad 2a can be connected to the bonding pad 1e by a re-wiring line 3a', thus connecting the bump pad 2a to the high potential (H), as shown in FIG. 4(b), by using such a bonding option.

Thus, the bump pads 2 can be fastened to either a high potential or a low potential by means of bonding options; in this way, the word-bit construction can be altered in the case of (for example) a DRAM or the like. Such an alteration of the wiring connection structure of the re-wiring 3 can be advantageously used in cases where a treatment, such as alteration of the word-bit construction of the semiconductor device, alteration of the input-output bus width or classification of these values according to the operating speed of the semiconductor element is necessary, as described above.

Figure 6:
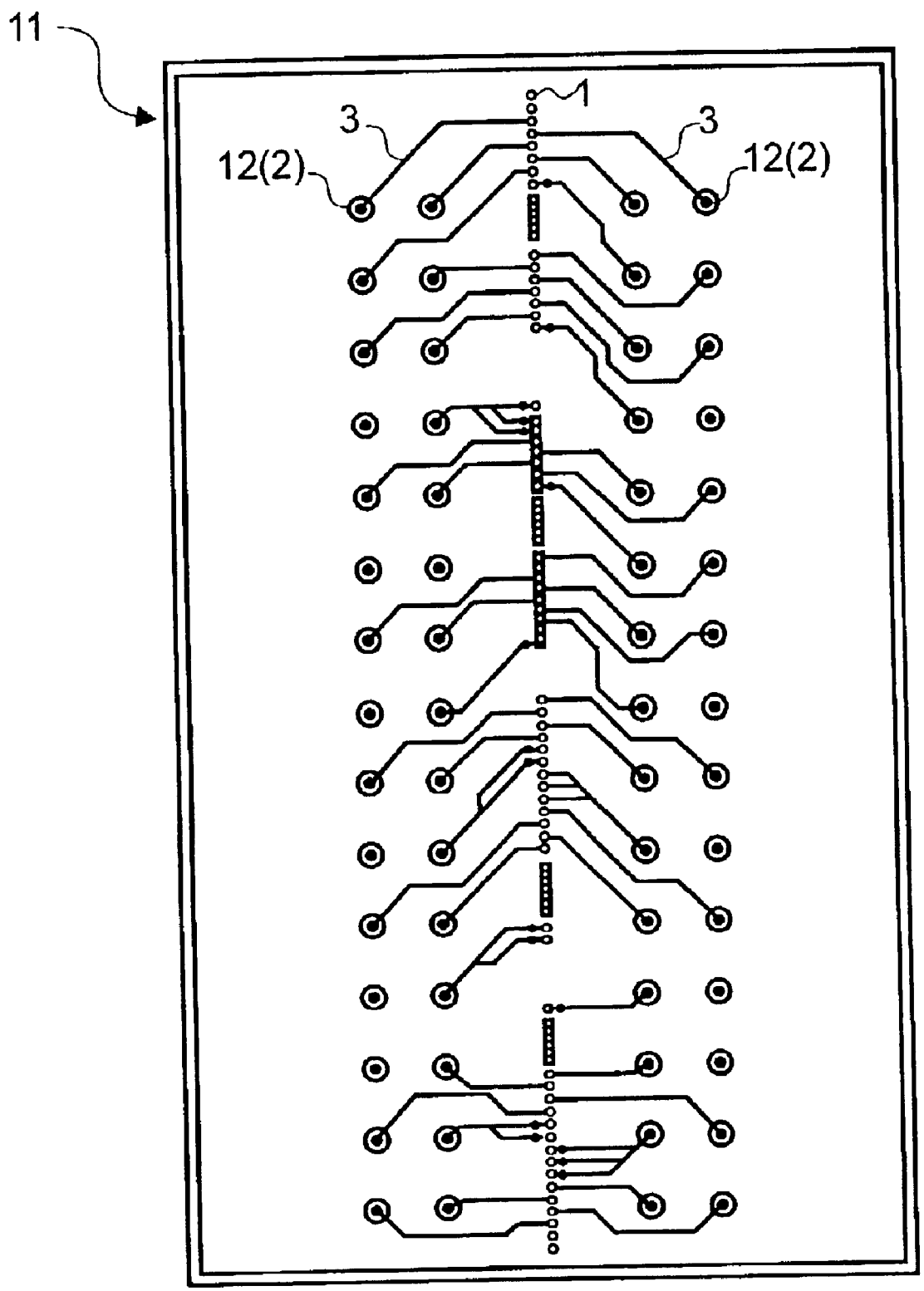
FIG. 6 is a diagrammatic plan view which illustrates a semiconductor device with a center pad layout structure in one embodiment of the present invention.
Figure 7:
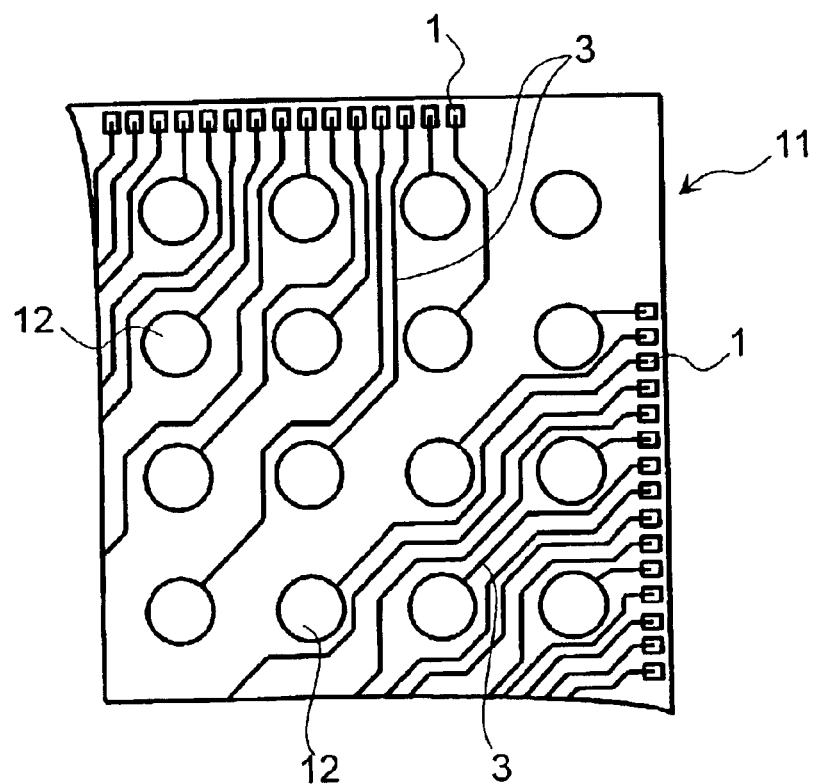
FIG. 7 is a plan view which shows the corner part of a semiconductor device with a four-sided pad layout structure in one embodiment of the present invention.
Figure 19:
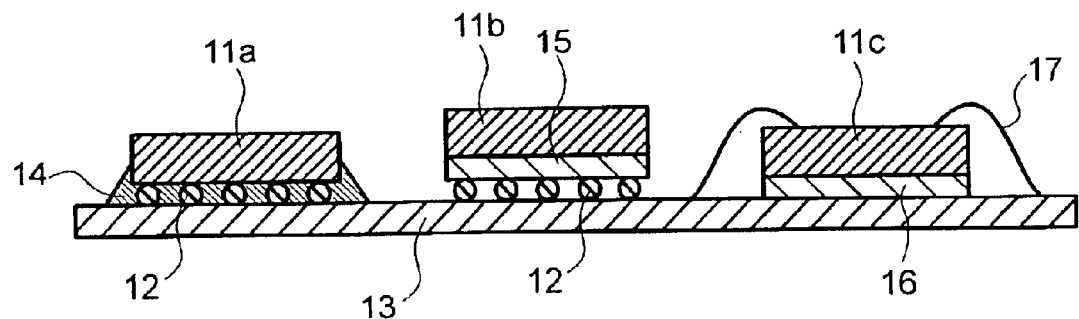
FIG. 19 is a sectional view which shows another example of a semiconductor device with a multi-chip modular structure in one embodiment of the present invention.

Next, one example of a method of manufacture of a semiconductor device using the WLCSP technique of the present embodiment will be described with reference to FIGS. 5(a) through 7. FIGS. 5(a) through 5(e) are diagrams which illustrate the sequence of the semiconductor device manufacturing process using this WLCSP technique; FIG. 6 is a plan view which illustrates a semiconductor device with a center pad layout structure FIG. 7 is a plan view which shows the corner part of a semiconductor device with a peripheral pad layout structure; and FIG. 19 is a sectional view which shows another example of a semiconductor device with a multi-chip modular structure.

FIG. 5(a) shows, in model form, a plan view of the semiconductor wafer 10 following the wafer process. Here, the wafer process is also referred to as a pre-process; this term refers to a process in which semiconductor elements are formed on the main surface of a wafer that has been subjected to mirror surface polishing; a wiring layer is formed; a surface protective layer is formed; and, the wafer is placed in a state that makes it possible to perform respective electrical tests by means of a probe or the like on a plurality of semiconductor chips 11 formed on the semiconductor wafer 10.

For example, the semiconductor wafer 10 consists of a p-type silicon single crystal or the like, which has a substantially circular shape as seen in a plan view; and furthermore, a plurality of semiconductor chips 11 which have (for example) a rectangular shape, are regularly disposed in rows in the vertical and left-right directions, as shown in FIG. 5(a). In the center of each semiconductor chip 11, with respect to the direction of its width, a plurality of bonding pads 1 are disposed in a row along the direction of the length of the semiconductor chip 11 (this is an example of a center pad layout). These bonding pads 1 are also referred to as external terminals and are electrodes that are used to lead the electrodes of the semiconductor elements and circuits formed on the semiconductor chips 11 to the outside. Electrical tests are performed on the respective semiconductor chips 11 by causing the abovementioned probe or the like to contact the bonding pads 1.

Next, FIG. 5(b) shows, in model form, a plan view of the semiconductor wafer 10 following the re-wiring formation process. The re-wiring lines 3 are wiring lines that electrically connect the bonding pads 1 of the semiconductor chips 11 with the bump pads 2, on which bumps or the like that are used to mount the semiconductor chips 11 on specified circuit boards are carried; these wiring lines are used for dimensional matching of the bonding pads 1, which are governed by the dimensions of the wafer process, and the bump pads 2, which are governed by the dimensions of the packaging process.

Specifically, since the dimensions of the bump pads 2 (dimensions of the bump pads themselves and spacing of adjacent bump pads) are governed by the dimensions on the circuit board side, dimensions that are relatively larger than the dimensions of the bonding pads 1 (dimensions of the bonding pads themselves and spacing of adjacent bonding pads) are required. As a result, the small bonding pads 1 governed by the wafer process cannot be used "as is" as bump pads 2. Accordingly, a structure is used in which bump pads 2, that have relatively larger dimensions, are disposed in relatively broad empty regions of the semiconductor chip 11, and these bump pads 2 and the bonding pads 1 are electrically connected by re-wiring lines 3.

In this re-wiring formation process, it is possible to form at least some of the re-wiring lines 3 that connect the bonding pads 1 and bump pads 2 of the semiconductor chip 11 by means of bonding options, using a photolithographic technique that does not require a photomask, in order to manufacture a semiconductor device with the performance required by the customer (details will be described later). Specifically, the re-wiring lines 3 of a standard portion (first portion) are formed beforehand, while in a portion (second portion) that corresponds to the specifications of the customer, the wiring pattern is formed by altering the combination of connections between the bonding pads 1 and bump pads 2 in the final stage of the re-wiring formation process.

Next, FIG. 5(c) shows, in model form, a plan view of the semiconductor wafer 10 following the bump formation process. The bumps 12 are mounted on the bump pads 2, and they consist of (for example) an Sn—Ag—Cu solder, an Sn—Ag solder, an Sn—Cu solder or the like. Among these types of bumps, electrodes with a protruding cross-sectional shape consisting of an Sn-(3 wt %) Ag-(0.5 wt %) Cu solder are especially desirable from the standpoint of high connection reliability. These bumps 12 are formed on the insulating film that covers the abovementioned re-wiring lines 3, and are electrically connected to the re-wiring lines 3 via the opening parts formed in this insulating film, so that the bumps 12 are further electrically connected to the bonding pads 1.

Next, FIG. 5(*d*) shows a plan view of one semiconductor chip 11 following the dicing process. The dicing process is a process in which semiconductor chips 11 are individually cut from the semiconductor wafer 10. In the stage in which the semiconductor chips 11 are cut from the semiconductor wafer 10, the semiconductor chips 11 already have a CSP structure. For example, in the case of a semiconductor device with a center pad layout structure such as that shown in FIG. 6, the bonding pads 1 are disposed in a rectilinear row in the center of the semiconductor chip 11, and they are electrically connected to the bump pads 2 and the bumps 12 mounted on these bump pads 2 via the re-wiring lines 3.

Furthermore, for example, in the case of a semiconductor device with a peripheral pad layout structure of the type shown in FIG. 7, a plurality of bonding pads 1 are disposed in rows that run along the four sides of the semiconductor chip 11 in the vicinity of these sides of the semiconductor chip 11. The respective bonding pads 1 are electrically connected to the bump pads 2 that are disposed on the main surface of the semiconductor chip 11, and to the bumps 2 mounted on these bump pads 12, via re-wiring lines 3.

Next, FIG. 5(*e*) shows a sectional view of a semiconductor device following the semiconductor chip mounting process. For example, this figure shows a semiconductor device with a multi-chip modular structure. Although there are no particular restrictions on this specified structure, this figure shows an example in which a plurality of semiconductor chips 11 (CSP) are mounted on the main surface of a circuit board 13 in a state in which the bumps 12 of the semiconductor chips 11 are connected to the wiring of the circuit board 13, with a filling material (underfill) 14 interposed between the main surfaces of the semiconductor chips 11 and the main surface of the circuit board 13. The filling material 14 consists of a low-temperature heat-curable epoxy type resin.

Furthermore, a structure in which no filling material 14 is interposed, or a structure in which a plurality of different types of semiconductor devices are mounted (besides a structure in which a plurality of semiconductor devices of the same type are mounted, as shown in FIG. 5(*e*)), may be used in a semiconductor device with a multi-chip modular structure. For instance, FIG. 19 shows an example in which three types of semiconductor chips 11, 11*b* and 11*c* are mounted on a circuit board 13. The semiconductor chip 11*a* is mounted in a flip-chip manner in which a filling material 14 is interposed as described above; the semiconductor chip 11*b* is mounted in a flip-chip manner in which a stress relaxation layer 15 is formed and no filling material 14 is used; and, the semiconductor chip 11*c* is mounted using a combination of die bonding via an adhesive agent 16 (silver paste) and a wire bonding system using a wire 17.

Figure 8:
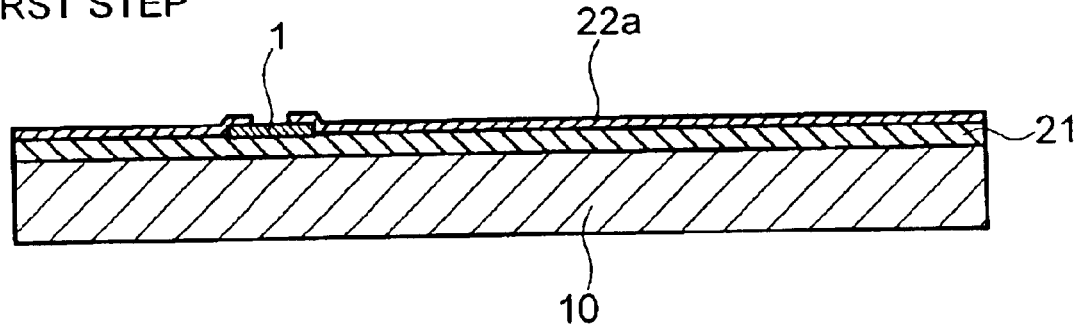
FIG. 8 is a sectional view of part of a semiconductor device illustrating a first step in a semiconductor device manufacturing process of one embodiment of the present invention.
Figure 9:
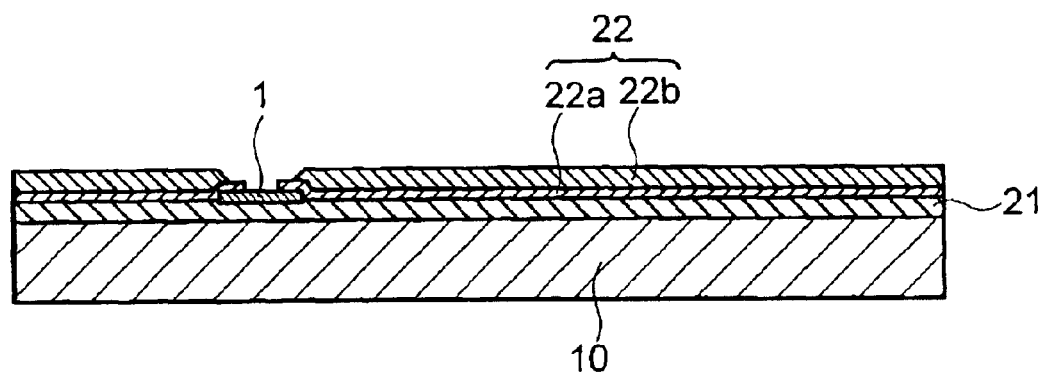
FIG. 9 is a sectional view of part of a semiconductor device illustrating a second step in a semiconductor device manufacturing process of one embodiment of the present invention.
Figure 14:
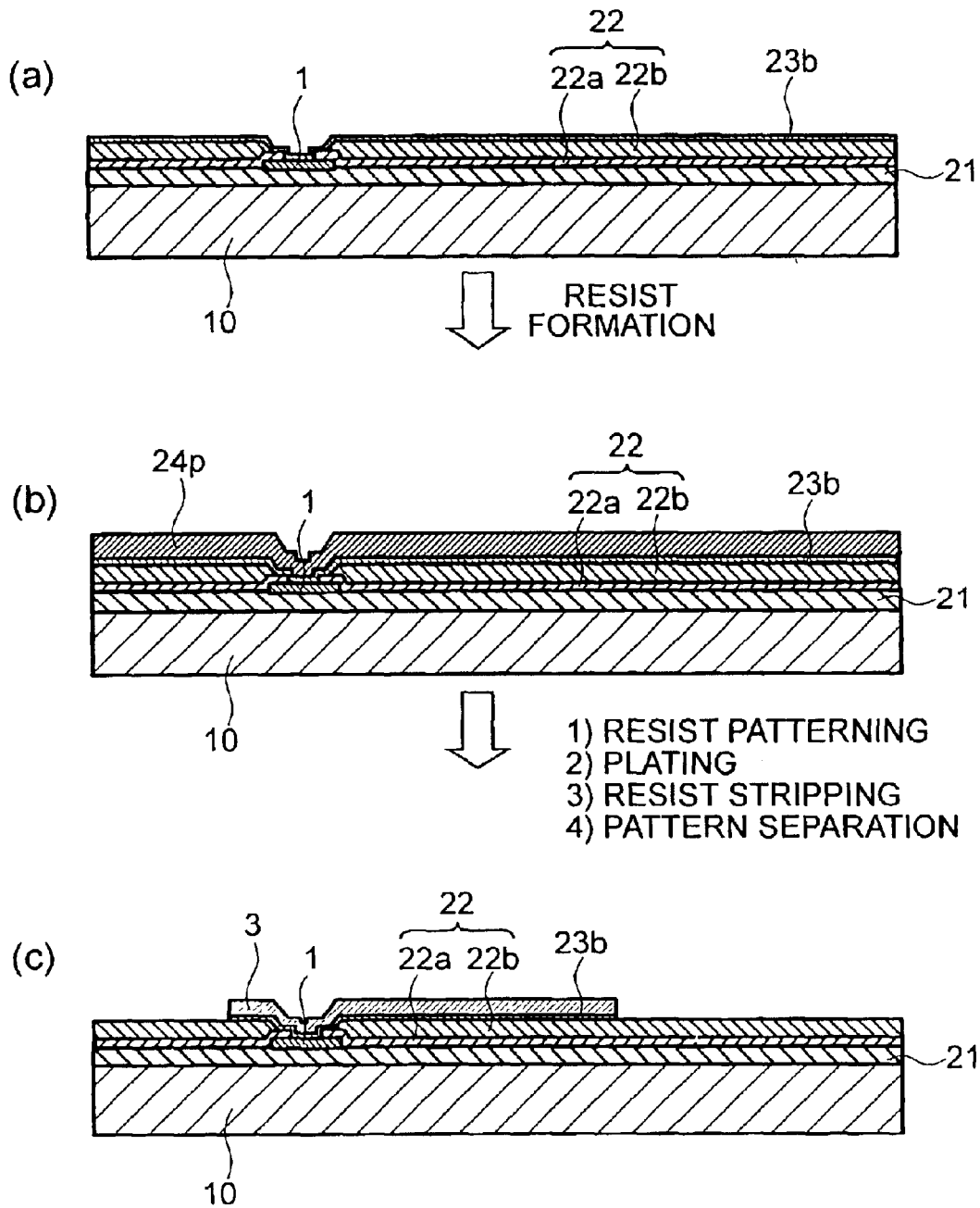
FIGS. 14(a) through 14(c) are sectional views of part of a semiconductor device illustrating a different third step in a semiconductor device manufacturing process of one embodiment of the present invention.
Figure 15:
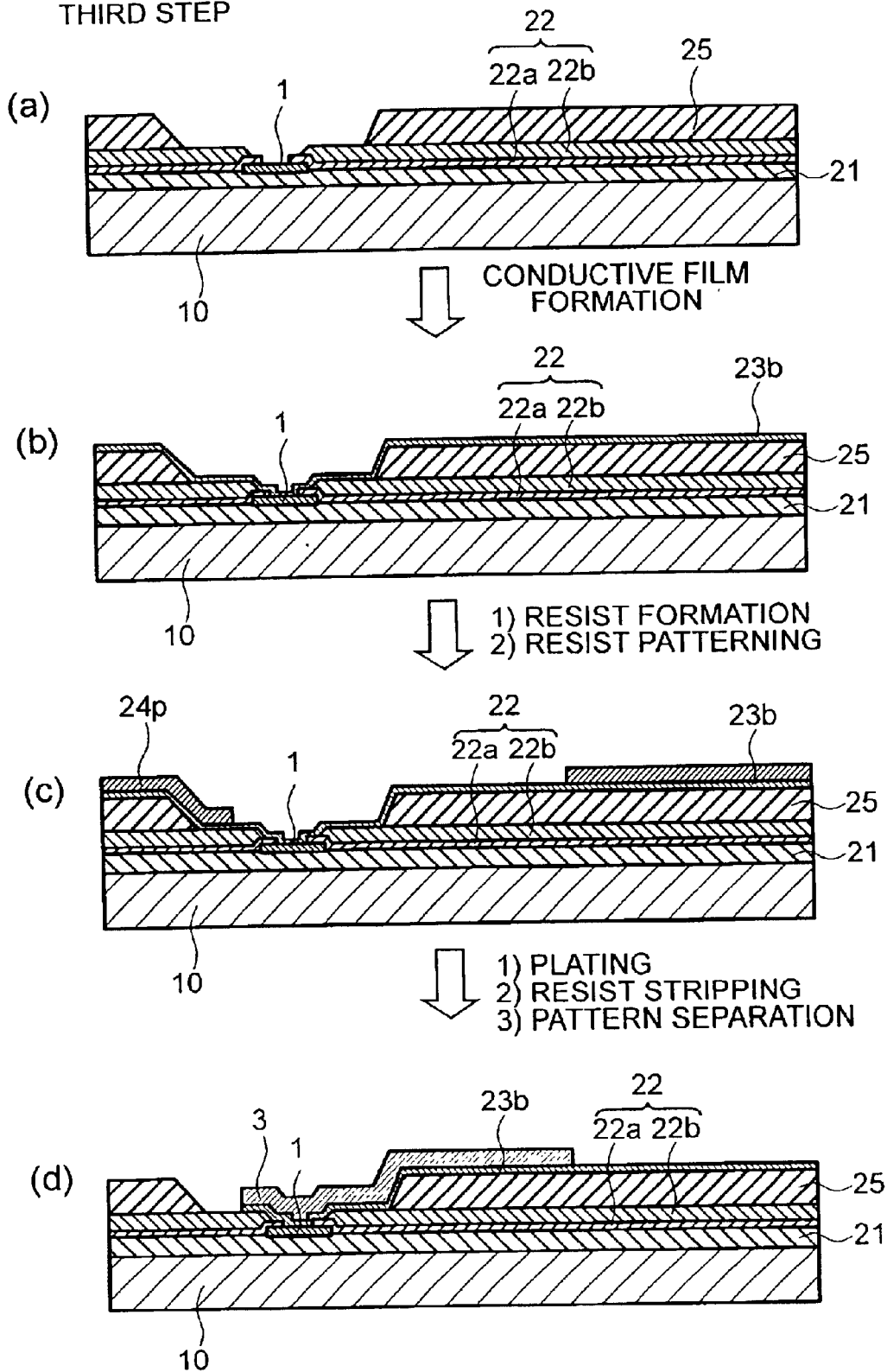
FIGS. 15(a) through 15(d) are sectional views of part of a semiconductor device illustrating still another third step in a semiconductor device manufacturing process of one embodiment of the present invention.
Figure 16:
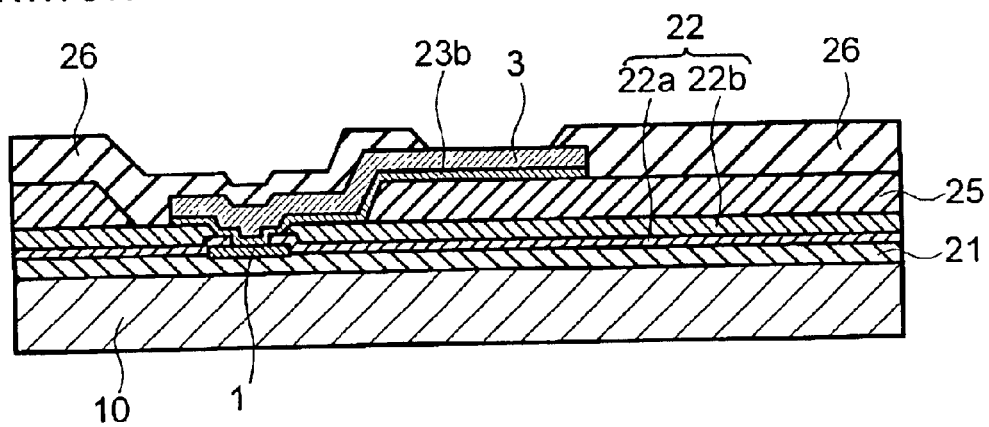
FIG. 16 is a sectional view of part of a semiconductor device illustrating a fourth step in a semiconductor device manufacturing process of one embodiment of the present invention.
Figure 17:
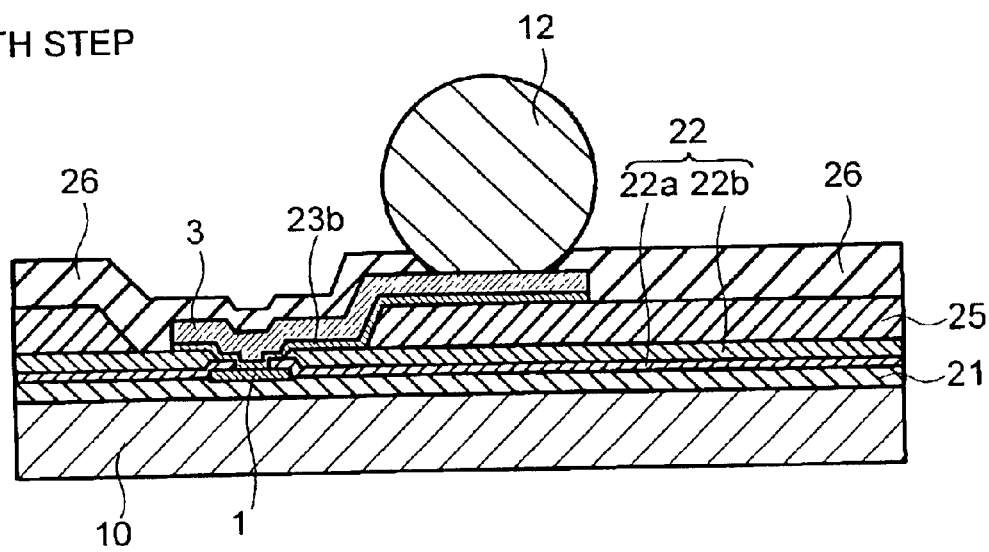
FIG. 17 is a sectional view of part of a semiconductor device illustrating a fifth step in a semiconductor device manufacturing process of one embodiment of the present invention.
Figure 18:
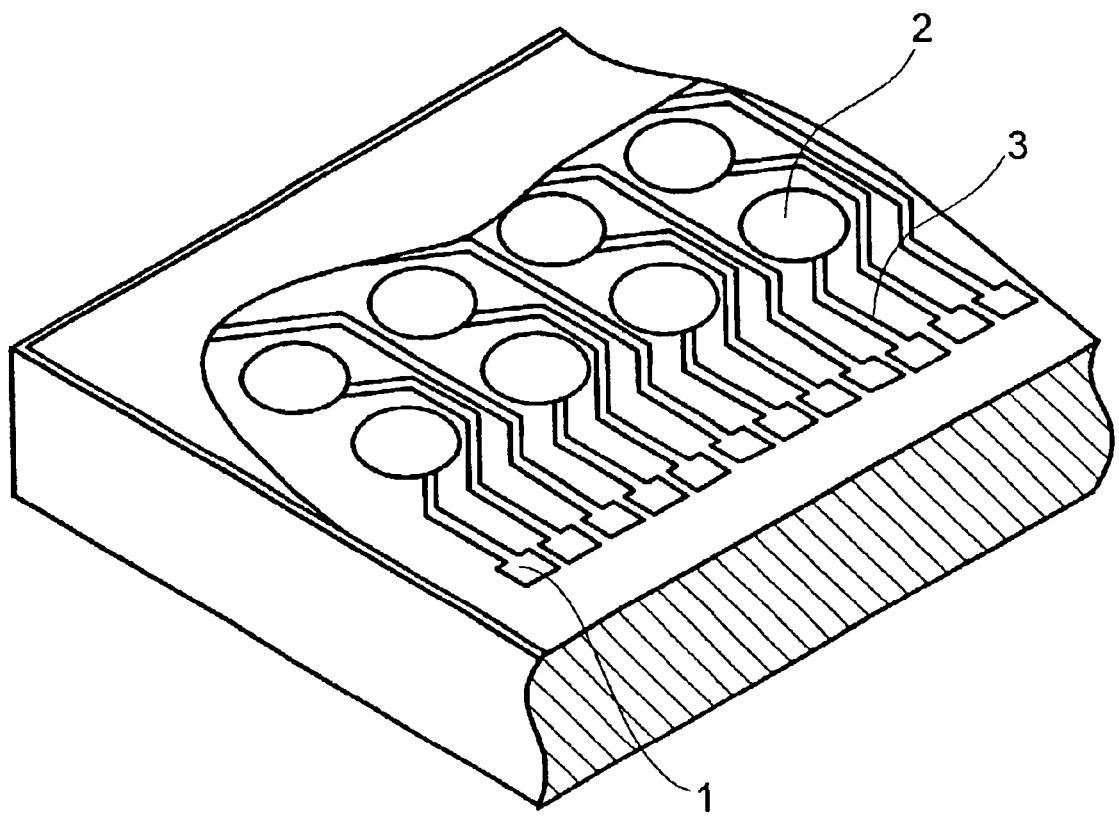
FIG. 18 is a perspective view showing the wiring connection structure of the re-wiring in a semiconductor device investigated as a prerequisite of the present invention.

Next, the semiconductor device manufacturing process of the present embodiment will be described in detail with reference to FIGS. 8 through 18. FIG. 8 is a sectional view of a part of a semiconductor device which illustrates a first step; FIG. 9 is a sectional view of a part of a semiconductor device which illustrates a second step; FIGS. 10(*a*) through 10(*c*) are sectional views of part of a semiconductor device which illustrate a third step; FIGS. 11(*a*) and 11(*b*) are diagrams which illustrate patterns on a photomask; FIGS. 12(*a*), 12(*b*), 13(*a*) and 13(*b*) are diagrams which illustrate maskless exposure; FIGS. 14(*a*) through 14(*c*) are sectional views of a part of a semiconductor device which illustrate another third step; FIGS. 15(*a*) through 15(*d*) are sectional views of a essential part of a semiconductor device which illustrate a further alternative third step; FIG. 16 is a sectional view of part of a semiconductor device which illustrates a fourth step; and, FIG. 17 is a sectional view of a part of a semiconductor device which illustrates a fifth step.

FIG. 8 illustrates the first step and shows one example of the partial sectional structure of the semiconductor device following the wafer process. In this first step, a semiconductor wafer 10, on which semiconductor chips 11 with finished bonding pads 1 to be used for external connection are formed, is formed by a so-called pre-process in the same manner as in a conventional semiconductor device.

Specifically, in this preprocess, specified semiconductor elements are formed on the main surface of the semiconductor wafer 10. Furthermore, respective layers are formed on the main surface of the semiconductor wafer 10 by alternately stacking wiring layers and inter-layer insulating layers. In the figure, only a bonding pad 1 of the uppermost wiring layer, that is formed on the surface of an insulating layer 21, is shown. For example, this bonding pad 1 is formed from aluminum or the like. Furthermore, a surface protective film consisting of an insulating film 22*a* is formed on the insulating layer 21; thus, this will be described together with the formation of the protective film 22 (first insulating layer) in the second step. A portion of the upper surface of this bonding pad 1 is exposed as a result of an opening being formed in the insulating film 22*a* that is disposed on the insulating layer 21.

Next, FIG. 9, which illustrates the second step, shows one example of the partial sectional structure of the semiconductor device following the formation of the protective film. In this second step, a protective film 22 is formed on the abovementioned semiconductor wafer 10. In some cases, this protective film 22 may already have been formed in the first step constituting the so-called pre-process; and, in such cases, this step may be omitted, and the formation of the protective film 22 may be performed in the first step.

In the present embodiment, the protective film 22 is formed as follows: specifically, the surface of the insulating film 22*a* consisting of an inorganic material that is formed in the so-called pre-process, e. g., an insulating film 22*a* consisting of silicon nitride formed by a CVD process or the like, silicon dioxide formed using tetraethoxysilane or the like, or a composite film consisting of both of these, is coated with a photosensitive polyimide or the like constituting an insulating film 22*b* that consists of an organic material; and, this film is exposed, developed and cured to form a protective film 22 with a thickness of approximately 6 μm. However, the present invention is not limited to this; namely, there is no particular problem in using a customary universally known protective film 22.

As was described above, this protective film 22 is an insulating film; accordingly, in the following description of the present embodiment, this will be referred to as the first insulating layer. Furthermore, a plurality of opening parts are formed in the first insulating layer, and at least some of these opening parts are positioned above the bonding pads 1 of the semiconductor chip 11.

Next, the third step of the process is a step in which re-wiring lines 3 (a wiring layer) are formed. Preferred embodiments of this third step include several variations. Here, three embodiments, i. e., first, second and third embodiments, will be described in order. Since these re-wiring lines 3 consist of a wiring pattern, the re-wiring lines may also be referred to as a wiring layer in the description of the present embodiments.

FIGS. 10(a) through 10(c) illustrate a first embodiment of the third step; these figures illustrate one example of the partial sectional structure of a semiconductor device in respective steps up to the completion of the formation of the re-wiring lines 3. In this third step, re-wiring lines 3 are formed. First, as is shown in FIG. 10(a), a conductive film 23a is formed on the surface of the semiconductor wafer 10 that has been subjected to the abovementioned second step. There are no particular problems as long as this conductive film 23a is a customary universally known conductor used for re-wiring lines 3 in WLCSP; thus, a film consisting of copper or the like is especially suitable. Furthermore, from the standpoints of connection reliability and adhesion reliability of the re-wiring lines 3 formed in the third step, it is advantageous to use a sputtering process for the formation of the conductive film 23a.

More specifically, a layer which is used to ensure the adhesion of the re-wiring lines 3 and the protective film 22(22b) of the fist insulating layer, and a layer which forms the conductor of the wiring, are continuously formed after sputter-etching has been performed. Chromium, titanium, tungsten or the like can be used as the layer that is used to ensure the abovementioned adhesion. In the present embodiment, a chromium layer with a thickness of approximately 75 nm is used, and a conductor that forms the wiring, i. e., in concrete terms, copper, a copper-nickel alloy or the like, is continuously formed on the upper part of this adhesive layer. In the present embodiment, a conductive film 23a with a three-layer structure is used in which copper is used as the conductive metal, and chromium, which shows barrier properties and adhesion to the upper layers, is formed on top of this conductive metal.

Next, as shown in FIG. 10(b), an etching resist 24e is formed on top of the abovementioned conductive film 23a, and this resist 24e is patterned by a photolithographic technique using a photomask. In this case, a photomask is used which has at least one location that is patterned so that a bump pad 2 is connected to two or more bonding pads 1. FIGS. 11(a) and 11(b) illustrate examples of photomasks in which one bump pad 2 is connected to two bonding pads 1. These figures show enlargements of portions of the images formed on photomasks used in cases where the abovementioned resist 24e is a positive type resist. In the mask pattern example shown in FIG. 11(a), a bonding pad ha is connected to a bonding pad 1b via a bump pad 2c; while, in the mask pattern example shown in FIG. 11(b), a re-wiring line 3 extending from the bump pad 2c branches into two lines that are respectively connected to the bonding pads 1a and 1b. When a positive type resist is used, the portions of the resist 24e that are not screened by the mask are photo-degraded; accordingly, the resist patterns that are formed at the time of exposure through the photomasks that are shown, for example, in FIGS. 11(a) and 11(b) form etching resists.

Thus, in the first embodiment of the third step, the resist 24e is patterned by exposure through a photomask (partial structures of which are shown as examples in FIGS. 11(a) and 11(b) and subsequent development. Thus, prior to etching, an additional exposure is performed using a maskless exposure apparatus on part 1a -X or part 1b-X shown in FIGS. 12(a) and 12(b), and development is performed again, so that the resist 24e has the shape shown for example in FIG. 13(a) or 13(b) For example, in cases where a remedy on wiring is performed, an inspection is performed so that wiring (wiring pads) with defects or the like is detected; afterward, the wiring pattern is altered by performing a maskless exposure. Accordingly, a detection step may be inserted prior to the maskless exposure. Similarly, in cases where the operating speed of the semiconductor element is altered, an inspection step that will evaluate the operating speed or the like is performed prior to maskless exposure; then, the wiring is formed by maskless exposure. As an example, FIG. 13(a) shows the shape that is obtained when the part 1a-X in FIG. 12(a) is subjected to an additional exposure, while FIG. 13(b) shows the shape that is obtained when the part 1b-X in FIG. 12(a) is subjected to an additional exposure.

By performing such an additional exposure treatment, it is possible to achieve bonding options even in WLCSP; thus, the characterizing feature of the present embodiment is that a maskless exposure apparatus is used in the stage of this additional exposure. As a result of this additional exposure using a maskless exposure apparatus, there is no need to use a photomask; accordingly, bonding options can be handled in a flexible manner.

Furthermore, to outline the abovementioned maskless exposure apparatus, this apparatus performs exposure using a DMD (Digital Micro-mirror Device) projector. The DMD of this DMD projector is a device containing micro-mirrors that are approximately 10 to 20 $\mu$m square, in which the ON/OFF function of the respective micro-mirrors can be digitally controlled. Maskiess exposure can be performed by causing light to strike the device on which the image is formed in accordance with the ON/OFF functions of the respective micro-mirrors, so that the image is reflected or projected. A reduction projection exposure or the like can also be performed in this maskless exposure in the same manner as in an exposure using a mask.

Furthermore, in the abovementioned step, treatment is performed in the order photomask exposure→development→maskless additional exposure→additional development; on the other hand, this treatment may also be performed as photomask exposure→maskless additional exposure→development. By using such a step, it is possible to omit one developing step; accordingly, bonding options can be accomplished in an even shorter time.

In the steps described so far, the etching resist 24e is patterned, and the abovementioned conductive film 23a is then etched using this pattern as a mask. Afterward, re-wiring lines 3 with the desired circuit pattern (such as that shown in FIG. 10(c)) can be obtained by removing this etching resist 24e.

In the first embodiment of the abovementioned third step, an example of a step using a positive type resist was described; on the other hand, if a photomask is used in which the transparent regions and non-transparent regions are reversed, then a negative type resist can also be used. In this case, it is also advisable to make an appropriate adjustment of the regions that are subjected to an additional exposure.

Next, a second embodiment of the third step will be described with reference to FIGS. 14(a) through 14(c), which figures illustrate one example of the partial sectional structure of a semiconductor device in respective steps up to the completion of the formation of the re-wiring lines 3. As is shown in FIG. 14(a), the initial treatment in this second embodiment involves the formation of a conductive film 23b on the surface of the semiconductor wafer 10 that has been subjected to the abovementioned second step. Furthermore, in this second embodiment, the re-wiring lines 3 are formed by plating; accordingly, the conductive film 23b that is formed on the surface of the semiconductor wafer 10 preferably has a layer construction and film thickness that allow the use of this film as a seed layer for plating. Here, a customary universally known seed layer may be used; in the present embodiment, a seed layer, consisting of a chromium layer with a film thickness of approximately 75 nm and a copper layer with a film thickness of approximately 500 nm, is used.

Next, as shown in FIG. 14(b), a plating resist 24p, which forms a reverse pattern of the re-wiring lines 3, is formed on the surface of the abovementioned conductive film 23b; then, after this plating resist 24p is patterned, wiring is formed by plating. Subsequently, re-wiring lines 3 with a desired circuit pattern, such as that shown in FIG. 14(c), can be formed by removing this plating resist 24p and separating the pattern.

In this case, as in the abovementioned first embodiment, resist patterning with a desired circuit pattern can be accomplished by appropriately combining a photolithographic technique using a photomask and a maskless exposure technique. Furthermore, in cases where the part 1a-X or part 1b-X, shown for example in FIG. 12(a), is additionally exposed using the photomask shown for example in FIG. 11(a), the wiring shape shown in FIG. 13(a) or the shape shown in FIG. 13(b) will be respectively obtained by using a negative type resist Next, a third embodiment of the third step will be described with reference to FIGS. 15(a) through 15(d), which figures illustrate one example of the partial sectional structure of a semiconductor device in respective steps up to the completion of the formation of the re-wiring lines 3. In this third embodiment, as in the abovementioned second embodiment, the re-wiring lines 3 are formed by plating; however, an insulating layer 25 (stress relaxation layer) is formed between the re-wiring lines 3 and the protective film 22 (22b) of the first insulating layer, as shown in FIG. 15(a). Furthermore, since this insulating layer 25 has the function of relaxing stress that acts on the re-wiring lines 3, this insulating layer 25 may also be referred to as a stress relaxation layer in some cases. More specifically, such a stress relaxation layer is formed on the semiconductor wafer 10 prior to the formation of the conductive film 23b, that is formed first in the abovementioned first embodiment or the abovementioned second embodiment. It is desirable to provide the insulating layer 25 that forms this stress relaxation layer such that this insulating layer 25 avoids at least some of the opening parts formed in the protective film 22 of the first insulating layer.

Next, following the formation of the insulating layer 25 that forms the stress relaxation layer, re-wiring lines 3 with a desired circuit pattern, such as that shown in FIG. 15(d), can be formed by performing plating, resist stripping and pattern separation, following the steps of formation of the conductive film 23b shown in FIG. 15(b), formation of the plating resist 24p shown in FIG. 15(c), and resist patterning, in the same manner as in the abovementioned second embodiment. By performing the treatment in such a step order, the bonding options can be handled in a flexible manner.

Thus, the formation process of the re-wiring lines 3 in the third step is completed by performing the first, second or third embodiment. By thus using a maskless exposure technique that does not use a photomask for the resist patterning in the third step, it is possible to provide a manufacturing technique that can handle bonding options in WLCSP in which the CSP can be manufactured at low cost. As a result, product types can be varied in accordance with market demand, and a flexible response to customer demands for reduced cost and quick delivery is possible.

Furthermore, in the case of the re-wiring formation process in the abovementioned third step, a case was described in which a maskless exposure technique was used for the bonding options of the additional exposure. On the other hand, it would also be possible to treat all of the re-wiring lines 3, including the bonding options, using the order maskless exposure→development. Specifically, in the re-wiring formation process, a maskless exposure technique is used for the wiring patterns of the bonding options; on the other hand, in forming the wiring patterns of the re-wiring lines 3, other than the bonding options, exposure may be performed using a photomask, exposure may be performed by a maskless technique that does not use a photomask, or exposure may be performed by combining the use of a photomasks and a maskless technique.

(1) In cases where the wiring patterns, other than the bonding options, are formed by mask exposure, the formation of the portions that do not constitute bonding options can be easily and efficiently accomplished by forming these portions that do not constitute bonding options at one time by mask exposure.

(2) In cases where the wiring patterns, other than the bonding options, are also formed by maskless exposure, there is no need to prepare two different types of exposure optical equipment; accordingly, the equipment investment used for mass production can be reduced. Furthermore, since maskless exposure equipment is generally smaller than mask exposure equipment, the floor space of the building for installation of the equipment can be reduced, so that equipment investment and equipment running costs can be reduced in this regard as well.

(3) In cases where the wiring patterns, other than the bonding options, are divided into parts that are formed by maskless exposure and parts that are formed by mask exposure, the combined use of mask exposure and maskless exposure makes it possible to provide large item small volume production of semiconductor devices in an efficient manner by using mask exposure for the common parts of the semiconductor devices, and using maskless exposure in places where there are numerous alterations of the wiring pattern in accordance with the type of semiconductor device and user requirements, or in places where it is difficult to expose the wiring pattern (i. e., to form the wiring) using a mask.

Next, FIG. 16 illustrates the fourth step. This figure shows one example of the partial sectional structure of a semiconductor device in a state in which the fourth step has been completed in the abovementioned third embodiment. In this fourth step, a second insulating layer 26, consisting of an insulating film, is formed. This second insulating layer 26 is formed so that at least some of the areas above the bump pads 2 are opened, and so that the upper parts of at least the abovementioned first insulating layer 22, bonding pads 1, stress relaxation layer 25 and re-wiring lines 3 are covered. This second insulating layer 26 is ordinarily formed using a photomask. Thus, this layer constitutes the outermost surface protective layer of the semiconductor device; accordingly, considering the use of dummy bumps and the like, a maskless exposure technique that does not use a photomask may also be used for patterning.

Furthermore, in the first embodiment or second embodiment of the abovementioned third step, the formation of a stress relaxation layer 25 was omitted. In these embodiments, therefore, the semiconductor device, following the completion of the fourth step has a partial sectional structure in which there is no stress relaxation layer 25 of the type shown in FIG. 16. In the first embodiment and second embodiment as well, it goes without saying that a maskless exposure technique may be used in the formation of the second insulating layer 26 in the same manner as in the third embodiment.

Next, FIG. 17 illustrates the fifth step. This figure shows one example of the partial sectional structure of a semiconductor device following bump formation (an example of the abovementioned third embodiment). In this fifth step, solder balls are connected to the bump pads 2, thus forming bumps 12 that act as external terminals.

Finally, the semiconductor wafer 10, on which semiconductor devices have been formed, is cut into individual semiconductor devices by a wafer dicing technique. As a result, WLCSP semiconductor devices that are intended for flip-chip connections can be completed.

Thus, if the semiconductor device and semiconductor device manufacturing method of the present embodiments are used, the combination of connections between bonding pads 1 and bump pads 2, that are connected to each other by re-wiring lines 3, can be quickly and easily rearranged by forming at least some of the re-wiring lines 3, that are used for the electrical connection of the bonding pads 1 and bump pads 2, using a photolithographic technique that does not require a photomask; and, as a result, a semiconductor device with the performance required by customers can be provided in a short period.

Furthermore, by exposing semiconductor devices that have a stress relaxation layer (shock absorbing layer) consisting of a thick insulating layer using DMD, without using a mask, as in the third embodiment, it is possible to obtain the following merits: specifically, since the wiring is formed on inclined parts of the stress relaxation layer, these inclined parts are illuminated by light from an inclined angle when the inclined parts are exposed; as a result, the amount of illumination per unit area is smaller than the amount of exposing light illuminating planar parts. Accordingly, when the resist used for plating or etching is patterned, the following problem may occur: namely, if the planar parts are illuminated with an appropriate amount of exposing light, the amount of exposure in the inclined parts may be insufficient; and, if illumination is performed so that the inclined parts receive an appropriate amount of exposure, the planar parts may be overexposed. One means of solving such a problem is a method in which only the inclined parts of the stress relaxation layer are subjected to an additional exposure; however, in the case of a photolithographic technique using a photomask, it is not always easy to adjust the amount of exposure to match the shape of the inclined parts. For example, in cases where the inclination varies among the peak parts and base parts of the inclined parts, it is necessary to vary the conditions of illumination among these peak parts and base parts; accordingly, a plurality of additional exposures may be required, and, in such cases, a plurality of photomasks used for such additional exposures must also be prepared. On the other hand, if the photolithographic technique of the present invention, which does not use a photomask, is employed, the amount of exposure can be flexibly varied in accordance with the shape of the inclined parts, so that there is no need for an additional exposure step or a photomask for use in such an additional exposure.

For example, means, such as varying the ON/OFF time ratios of the abovementioned micromirrors or the like, can be used in order to vary the amount of exposure in accordance with the shape of the inclined parts. The reason for this is that an optical effect that is comparable to a "half-tone mask pattern" can be obtained in approximate terms by adjusting the ON/OFF time ratios of the micro-mirrors.

In a photolithographic technique using a modulating optical element that employs micro-mirrors, photolithography not only of three-dimensional pattern shapes, but also of diverse patterns of different types, can be quickly and easily accomplished by using an approximate half-tone mask pattern generating technique, such as that described above. As a result of such special features, the present invention makes it possible to construct a manufacturing line for electronic devices that can handle variable volume production and large item small volume production in response to customer needs.

Embodiments of the present invention were described in concrete terms above. However, the present invention is not limited to the abovementioned embodiments; and, it goes without saying, that various alterations are possible within limits that involve no departure from the spirit of the invention. For example, the present invention is not limited to semiconductor devices such as a DRAM or the like, but can also be applied to mixed-mounting type semiconductor devices or the like in which memory circuits and logic circuits are formed on the same semiconductor substrate.

The embodiments disclosed in the present application may be summarized as follows:

The present invention provides a semiconductor device manufacturing method comprising a step (a) of forming a plurality of semiconductor chips on a semiconductor wafer, and a step (b) of performing a packaging process for the abovementioned plurality of semiconductor chips all at once in the wafer state, wherein the abovementioned step (a) comprises a step (a1) of forming semiconductor elements on the plurality of semiconductor chips of the abovementioned semiconductor wafer, a step (a2) of forming wiring layers on the abovementioned plurality of semiconductor chips, and a step (a3) of forming a first insulating layer on the abovementioned plurality of semiconductor chips with the upper surfaces of first connection terminals formed in the uppermost wiring layer of the abovementioned wiring layers left open, and the abovementioned step (b) comprises a step (b1) of forming a wiring layer on the surface of the abovementioned first insulating layer such that a first wiring portion of the wiring layer is connected to the abovementioned first connection terminals and a second wiring portion thereof forms second connection terminals, with at least a portion of this wiring layer being formed using a photolithographic technique that does not use a photomask (i. e., that does not require a photomask), and a step (b2) of forming a second insulating layer on the surface of the abovementioned wiring layer with the upper surfaces of the abovementioned second connection terminals left open.

Furthermore, the present invention provides a semiconductor device manufacturing method comprising a step (a) of forming a plurality of semiconductor chips on a semiconductor wafer, and a step (b) of performing a packaging process for the plurality of semiconductor chips all at once in the wafer state, wherein the step (a) comprises a step (a1) of forming semiconductor elements on the plurality of semiconductor chips of the semiconductor wafer, a step (a2) of forming wiring layers on the plurality of semiconductor chips, and a step (a3) of forming a first insulating layer on the plurality of semiconductor chips with the upper surfaces of first connection terminals formed in the uppermost wiring layer of the abovementioned wiring layers left open, and the abovementioned step (b) comprises a step (b1) of forming a stress relaxation layer on the surface of the first insulating layer with the upper surfaces of the first connection terminals left open, a step (b2) of forming a wiring layer on the surface of the abovementioned stress relaxation layer, such that a first wiring portion of the wiring layer is connected to the first connection terminals and a second wiring portion thereof forms second connection terminals, at least a portion of this wiring layer being formed using a photolithographic technique that does not use a photomask (i. e., that does not require a photomask), and a step (b3) of forming a second insulating layer on the surface of the wiring layer with the upper surfaces of the second connection terminals left open.

Furthermore, the present invention provides a semiconductor device which is formed by cutting a plurality of semiconductor chips formed on a semiconductor wafer into individual semiconductor chips after subjecting these semiconductor chips to a packaging process at one time in the wafer state, wherein said semiconductor device comprises (a) first connection terminals which are formed in the uppermost wiring layers of the abovementioned plurality of semiconductor chips, (b) a first insulating layer which is formed on the surfaces of the abovementioned plurality of semiconductor chips, with the upper surfaces of the abovementioned first connection terminals left open, (c) a wiring layer which is formed on the surface of the abovementioned first insulating layer, with a portion of this wiring layer being connected to the abovementioned first connection terminals, and with at least a portion of this wiring layer being formed using a photolithographic technique which does not use a photomask (i.e., which does not require a photomask), (d) second connection terminals which consist of another portion of the abovementioned wiring layer, and (e) a second insulating layer which is formed on the surface of the abovementioned wiring layer with the upper surfaces of the abovementioned second connection terminals left open.

Furthermore, the present invention provides a semiconductor device which is formed by cutting a plurality of semiconductor chips formed on a semiconductor wafer into individual semiconductor chips after subjecting these semiconductor chips to a packaging process at one time in the wafer state, wherein said semiconductor device comprises (a) first connection terminals which are formed in the uppermost wiring layers of the abovementioned plurality of semiconductor chips, (b) a first insulating layer which is formed on the surfaces of the abovementioned plurality of semiconductor chips, with the upper surfaces of the abovementioned first connection terminals left open, (c) a stress relaxation layer which is formed on the surface of the abovementioned first insulating layer with the upper surfaces of the abovementioned first connection terminals left open, (d) a wiring layer which is formed on the surface of the abovementioned stress relaxation layer, with a portion of this wiring layer being connected to the abovementioned first connection terminals, and with at least a portion of this wiring layer being formed using a photolithographic technique which does not use a photomask (i.e., which does not require a photomask), (e) second connection terminals which consist of another portion of the abovementioned wiring layer, and (f) a second insulating layer which is formed on the surface of the abovementioned wiring layer with the upper surfaces of the abovementioned second connection terminals left open.

Furthermore, the present invention provides a semiconductor device manufacturing method comprising a step (a) of forming a plurality of semiconductor chips on a semiconductor wafer, and a step (b) of performing a packaging process for the plurality of semiconductor chips all at once in the wafer state, wherein the abovementioned step (a) comprises a step (a1) of forming semiconductor elements on a plurality of semiconductor chips of the semiconductor wafer, a step (a2) of forming wiring layers on the plurality of semiconductor chips, and a step (a3) of forming a first insulating layer on the plurality of semiconductor chips with the upper surfaces of first connection terminals formed in the uppermost wiring layer of the wiring layers left open, and the abovementioned step (b) comprises a step (b1) of forming a wiring layer on the surface of the abovementioned first insulating layer such that a first wiring portion of the wiring layer is connected to the first connection terminals and a second wiring portion thereof forms second connection terminals, at least a portion of this wiring layer being formed by exposure to the reflected light on a device, which has a plurality of minute movable mirrors, from a light source, and operating the mirrors of this device in accordance with a preset pattern, and a step (b2) of forming a second insulating layer on the surface of the wiring layer with the upper surfaces of the abovementioned second connection terminals left open.

Furthermore, the present invention provides a semiconductor device manufacturing method comprising a step (a) of forming a plurality of semiconductor chips on a semiconductor wafer, and a step (b) of performing a packaging process for the plurality of semiconductor chips all at once in the wafer state, wherein the abovementioned step (a) comprises a step (a1) of forming semiconductor elements on a plurality of semiconductor chips of the abovementioned semiconductor wafer, a step (a2) of forming wiring layers on the plurality of semiconductor chips, and a step (a3) of forming a first insulating layer on the plurality of semiconductor chips with the upper surfaces of first connection terminals formed in the uppermost wiring layer of the wiring layers left open, and the abovementioned step (b) comprises a step (b1) of forming a stress relaxation layer on the surface of the abovementioned first insulating layer with the upper surfaces of the abovementioned first connection terminals left open, a step (b2) of forming a wiring layer on the surface of the stress relaxation layer such that a first wiring portion of the wiring layer is connected to the first connection terminals and a second wiring portion thereof forms second connection terminals, with at least a portion of this wiring layer being formed by exposure to the reflected light on a device, which has a plurality of minute movable mirrors, from a light source, and operating the mirrors of this device in accordance with a preset pattern, and a step (b3) of forming a second insulating layer on the surface of the wiring layer with the upper surfaces of the second connection terminals left open.

Furthermore, the present invention provides a semiconductor device which is formed by subjecting a plurality of semiconductor chips formed on a semiconductor wafer to a packaging process all at once in the wafer state, and then cutting out these plurality of semiconductor chips individually from the wafer, wherein said semiconductor device comprises (a) first connection terminals which are formed in the uppermost wiring layers of the abovementioned plurality of semiconductor chips, (b) a first insulating layer which is formed on the surfaces of the abovementioned plurality of semiconductor chips, with the upper surfaces of the abovementioned first connection terminals left open, (c) a wiring layer which is formed on the surface of the abovementioned first insulating layer, with a portion of this wiring layer being connected to the abovementioned first connection terminals, and with at least a portion of this wiring layer being formed by exposure to the reflected light on a device, which has a plurality of minute movable mirrors, from a light source, and operating the mirrors of this device in accordance with a preset pattern, (d) second connection terminals which consist of another portion of the wiring layer, and (e) a second insulating layer which is formed on the surface of the abovementioned wiring layer with the upper surfaces of the abovementioned second connection terminals left open.

Furthermore, the present invention provides a semiconductor device which is formed by subjecting a plurality of semiconductor chips formed on a semiconductor wafer to a packaging process all at once in the wafer state, and then cutting out these plurality of semiconductor chips individually from the wafer, wherein said semiconductor device comprises (a) first connection terminals which are formed in the uppermost wiring layers of the abovementioned plurality of semiconductor chips, (b) a first insulating layer which is formed on the surfaces of the plurality of semiconductor chips, with the upper surfaces of the abovementioned first connection terminals left open, (c) a stress relaxation layer which is formed on the surface of the first insulating layer with the upper surfaces of the abovementioned first connection terminals left open, (d) a wiring layer which is formed on the surface of the abovementioned stress relaxation layer, with a portion of this wiring layer being connected to the first connection terminals, and with at least a portion of this wiring layer being formed by exposure to the reflected light on a device, which has a plurality of minute movable mirrors, from a light source, and operating the mirrors of this device in accordance with a preset pattern, (e) second connection terminals which consist of another portion of the wiring layer, and (f) a second insulating layer which is formed on the surface of the wiring layer with the upper surfaces of the second connection terminals left open.

As was described above, the present invention makes it possible to provide bonding options in a semiconductor device with improved connection reliability. As a result, alterations in the connections of re-wiring can be handled in a flexible manner, so that semiconductor devices, with the performance required by customers, can be provided in a short time.

What is claimed is:

1. A semiconductor device manufacturing method comprising:
    (a) a step of forming a plurality of semiconductor chips on a semiconductor wafer; and
    (b) a step of performing a packaging process for said plurality of semiconductor chips on said semiconductor wafer all at once;
    wherein said step (a) comprises (a1) a step of forming semiconductor elements on said plurality of semiconductor chips of said semiconductor wafer, (a2) a step of forming at least one wiring layer on said plurality of semiconductor chips, said at least one wiring layer including an uppermost wiring layer overlying said plurality of semiconductor chips, said at least one wiring layer being in electrical connection with the plurality of semiconductor chips, and (a3) a step of forming a first insulating layer on said plurality of semiconductor chips, with upper surfaces of first connection terminals formed in the uppermost wiring layer of said at least one wiring layer being left exposed through the first insulating layer; and
    said step (b) comprises (b1) a step of forming a further wiring layer on the surface of said first insulating layer, such that a first wiring portion of the further wiring layer is connected to said first connection terminals and a second wiring portion thereof forms second connection terminals, with at least a portion of said further wiring layer being formed using a photolithographic technique that does not use a photomask, and (b2) a step of forming a second insulating layer on the surface of said further wiring layer, with upper surfaces of said second connection terminals left exposed through said second insulating layer.

2. The semiconductor device manufacturing method according to claim 1, wherein, in said step (b1), said first wiring portion of said wiring layer is formed using a photolithographic technique that uses a photomask, and said second wiring portion is formed using a photolithographic technique that does not use a photomask.

3. The semiconductor device manufacturing method according to claim 1, wherein, in said step (b1), said first wiring portion of said wiring layer is formed using a photolithographic technique that does not use a photomask, and said second wiring portion is also formed using a photolithographic technique that does not use a photomask.

4. The semiconductor device manufacturing method according to claim 1, wherein, in said step (b1), said first wiring portion of said wiring layer is formed using a photolithographic technique that uses a photomask and a photolithographic technique that does not use a photomask, and said second wiring portion is formed using a photolithographic technique that does not use a photomask.

5. The semiconductor device manufacturing method according to claim 1, wherein, in said step (b2), the second connection terminals are exposed through openings in a first portion of the second insulating layer, and the openings of said first portion of said second insulating layer are formed using a photolithographic technique that does not use a photomask.

6. The semiconductor device manufacturing method according to claim 1, wherein, in said step (b3), the second connection terminals are exposed through openings in a first portion of the second insulating layer, and the openings of a first portion of said second insulating layer are formed using a photolithographic technique that does not use a photomask.

7. The semiconductor device manufacturing method according to claim 1, further comprising, following said step (b), (c) a step of forming external connection terminals on said second connection terminals, and (d) a step of cutting a plurality of semiconductor chips individually from said semiconductor wafer.

8. The semiconductor device manufacturing method according to claim 7, further comprising, following said step (d), (e) a step of mounting said semiconductor chips on a circuit board via said external connection terminals in a state in which a filling material is interposed between the external connection terminals on said semiconductor chips and said circuit board.

9. A semiconductor device manufacturing method comprising:
    (a) a step of forming a plurality of semiconductor chips on a semiconductor wafer; and
    (b) a step of performing a packaging process for said plurality of semiconductor chips on said semiconductor wafer all at once;
    wherein said step (a) comprises (a1) a step of forming semiconductor elements on said plurality of semiconductor chips of said semiconductor wafer, (a2) a step of forming at least one wiring layer on said plurality of semiconductor chips, said at least one wiring layer including an uppermost wiring layer overlying said plurality of semiconductor chips, said at least one wiring layer being in electrical connection with the plurality of semiconductor chips, and (a3) a step of forming a first insulating layer on said plurality of semiconductor chips, with upper surfaces of first connection terminals formed in the uppermost wiring layer of said at least one wiring layer being left exposed through the first insulating layer; and said step (b) comprises (b1) a step of forming a stress relaxation layer on the surface of said first insulating layer, with the upper surfaces of said first connection terminals left exposed through the stress relaxation layer, (b2) a step of forming a further wiring layer on the surface of said stress relaxation layer such that a first wiring portion of the further wiring layer is connected to said first connection terminals and a second wiring portion thereof forms second connection terminals, with at least a portion of said further wiring layer being formed using a photolithographic technique that does not use a photomask, and (b3) a step of forming a second insulating layer on the surface of said further wiring layer, with upper surfaces of said second connection terminals left exposed through said second insulating layer.

10. The semiconductor device manufacturing method according to claim 9, wherein, in said step (b2), said first wiring portion of said wiring layer is formed using a photolithographic technique that uses a photomask, and said second wiring portion is formed using a photolithographic technique that does not use a photomask.

11. The semiconductor device manufacturing method according to claim 9, wherein, in said step (b2), said first wiring portion of said wiring layer is formed using a photolithographic technique that does not use a photomask, and said second wiring portion is also formed using a photolithographic technique that does not use a photomask.

12. The semiconductor device manufacturing method according to claim 9, wherein, in said step (b2), said first wiring portion of said wiring layer is formed using a photolithographic technique that uses a photomask and a photolithographic technique that does not use a photomask, and said second wiring portion is formed using a photolithographic technique that does not use a photomask.

13. The semiconductor device manufacturing method according to claim 9, further comprising, following said step (b), (c) a step of forming external connection terminals on said second connection terminals, and (d) a step of cutting a plurality of semiconductor chips individually from said semiconductor wafer.

14. The semiconductor device manufacturing method according to claim 13, further comprising, following said step (d), (e) a step of mounting said semiconductor chips on a circuit board via said external connection terminals in a state in which a filling material is interposed between the external connection terminals on said semiconductor chips and said circuit board.

15. A semiconductor device manufacturing method comprising:

a step (a) of forming a plurality of semiconductor chips on a semiconductor wafer; and a step (b) of performing a packaging process all at once of the semiconductor wafer;

wherein said step (a) comprises a step (a1) of forming semiconductor elements on said plurality of semiconductor chips of said semiconductor wafer, a step (a2) of forming at least one wiring layer on said plurality of semiconductor chips, said at least one wiring layer including an uppermost wiring layer overlying said plurality of semiconductor chips, said at least one wiring layer being in electrical connection with the plurality of semiconductor chips, and a step (a3) of forming a first insulating layer on said plurality of semiconductor chips, with upper surfaces of first connection terminals formed in the uppermost wiring layer of said at least one wiring layer being left exposed through the first insulating layer; and said step (b) comprises a step (b1) of forming a further wiring layer on the surface of said first insulating layer such that a first wiring portion of said further wiring layer is connected to said first connection terminals and a second wiring portion thereof forms second connection terminals, with forming of at least a portion of said further wiring layer including illuminating a device which has a plurality of minute movable mirrors with light from a light source, and operating the mirrors of this device in accordance with a preset pattern so that reflected light from the plurality of minute movable mirrors is irradiated on the semiconductor wafer in accordance with said preset pattern, and a step (b2) of forming a second insulating layer on the surface of said further wiring layer, with upper surfaces of said second connection terminals left exposed through the second insulating layer.

16. The semiconductor device manufacturing method according to claim 15, wherein said light source is located such that the light therefrom can illuminate the plurality of minute movable mirrors, and the device is located such that light irradiated from the plurality of minute movable mirrors can be irradiated on the semiconductor wafer.

17. The semiconductor device manufacturing method according to claim 15, wherein movement of said minute movable mirrors is controlled digitally, so as to provide said operating said mirrors according to said preset pattern.

18. A semiconductor device manufacturing method comprising:

a step (a) of forming a plurality of semiconductor chips on a semiconductor wafer; and a step (b) of performing a packaging process for said plurality of semiconductor chips on the semiconductor wafer all at once;

wherein said step (a) comprises a step (a1) of forming semiconductor elements on said plurality of semiconductor chips of said semiconductor wafer, a step (a2) of forming at least one wiring layer on said plurality of semiconductor chips, said at least one wiring layer including an uppermost wiring layer overlying said plurality of semiconductor chips, said at least one wiring layer being in electrical connection with the plurality of semiconductor chips, and a step (a3) of forming a first insulating layer on said plurality of semiconductor chips, with upper surfaces of first connection terminals formed in the uppermost wiring layer of said at least one wiring layer left exposed through the first insulating layer; and said step (b) comprises a step (b1) of forming a stress relaxation layer on the surface of said first insulating layers with the upper surfaces of said first connection terminals left exposed through the stress relaxation layer, a step (b2) of forming a further wiring layer on the surface of said stress relaxation layer such that a first wiring portion of the further wiring layer is connected to said first connection terminals and a second wiring portion thereof forms second connection terminals, with forming of at least a portion of said further wiring layer including illuminating a device which has a plurality of minute movable mirrors, with light from a light source, and operating the mirrors of said device in accordance with a preset pattern so that reflected light from the plurality of minute movable mirrors is irradiated on the semiconductor wafer in accordance with said preset pattern, and a step (b3) of forming a second insulating layer on the surface of said further wiring layer, with upper surfaces of said second connection terminals left exposed through the second insulating layer.

19. The semiconductor device manufacturing method according to claim 18, wherein movement of said minute movable mirrors is controlled digitally, so as to provide said operating said mirrors according to said preset pattern.

20. The semiconductor device manufacturing method according to claim 18, wherein said light source is located such that the light therefrom can illuminate the plurality of minute movable mirrors, and the device is located such that light irradiated from the plurality of minute movable mirrors can be irradiated on the semiconductor wafer.

* * * * *